US007266418B2

(12) United States Patent
Nakayama et al.

(10) Patent No.: US 7,266,418 B2
(45) Date of Patent: Sep. 4, 2007

(54) SUBSTRATE PROCESSING APPARATUS, HISTORY INFORMATION RECORDING METHOD, HISTORY INFORMATION RECORDING PROGRAM, AND HISTORY INFORMATION RECORDING SYSTEM

(75) Inventors: Youichi Nakayama, Nirasaki (JP); Daisuke Morisawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/283,825

(22) Filed: Nov. 22, 2005

(65) Prior Publication Data

US 2006/0224265 A1 Oct. 5, 2006

(30) Foreign Application Priority Data

Mar. 29, 2005 (JP) ............................. 2005-095123

(51) Int. Cl.
*G06F 19/00* (2006.01)
(52) U.S. Cl. ........................ 700/115; 700/108; 700/112; 700/121; 702/187
(58) Field of Classification Search ................ 700/121, 700/108, 109, 110, 115, 112; 438/5, 7, 9, 438/14, 16; 702/182, 183, 184, 185, 186, 702/187; 204/192.13, 192.33; 216/59, 60
See application file for complete search history.

(56) References Cited

U.S. PATENT DOCUMENTS

| | | | |
|---|---|---|---|
| 6,077,386 A * | 6/2000 | Smith et al. | ........... 156/345.24 |
| 6,267,545 B1 | 7/2001 | Mooring et al. | |
| 6,419,801 B1 * | 7/2002 | Smith et al. | ................... 216/60 |
| 6,805,810 B2 * | 10/2004 | Smith et al. | ................... 216/60 |
| 6,901,306 B2 * | 5/2005 | Nakamoto et al. | ........... 700/121 |
| 6,952,656 B1 * | 10/2005 | Cordova et al. | ............ 700/121 |
| 7,031,792 B2 * | 4/2006 | Yoshimoto et al. | ......... 700/121 |
| 7,113,838 B2 * | 9/2006 | Funk et al. | ................. 700/121 |
| 2003/0019840 A1 * | 1/2003 | Smith et al. | ................... 216/60 |
| 2003/0093174 A1 * | 5/2003 | Nikulin | ...................... 700/121 |
| 2005/0095774 A1 * | 5/2005 | Ushiku et al. | .............. 438/222 |

FOREIGN PATENT DOCUMENTS

| | | |
|---|---|---|
| JP | 2002-110496 | 4/2002 |
| JP | 2003-503844 | 1/2003 |

\* cited by examiner

*Primary Examiner*—Leo Picard
*Assistant Examiner*—Charles Kasenge
(74) *Attorney, Agent, or Firm*—Oblon, Spivak, McClelland, Maier & Neustadt, P.C.

(57) ABSTRACT

A substrate processing apparatus, which includes a plurality of process chambers for processing a substrate and a transfer part for carrying in and carrying out the substrate to and from the plurality of process chambers, includes a transfer history recording part, a process history recording part, and an alarm history recording part. The transfer history recording part relates history information concerning a transfer of the substrate by the transfer part to each substrate, and records the history information as first history information. The process history recording part relates history information concerning a process state of the substrate in each of the plurality of process chambers to each substrate subject to be processed, and records the history information as second history information. The alarm history recording part relates history information concerning an alarm occurred in at least one of the transfer part and the process chambers to each substrate, and records the history information as third history information.

10 Claims, 17 Drawing Sheets

| Group ItemName | | Value | Max | Min |
|---|---|---|---|---|
| 1 LIFTER CONTROL | | ENABLED | 1 | 0 |
| 1 PRESSURE CONTROL | | ENABLED | 1 | 0 |
| 1 APC CONTROL | | ENABLED | 1 | 0 |
| 1 GAS CONTROL | | ENABLED | 1 | 0 |
| 1 LAMP HEATER CONTROL | | ENABLED | 1 | 0 |
| 1 COLD/WARM WATER CIRCULATION CONTROL | | DISABLED | 1 | 0 |
| | | | | |
| Group ItemName | | Value | Max | Min |
| 3 TOLERANCE TABLE INPUT METHOD | | % INPUT | 2 | 1 |
| 1 PROLOGUE/EPILOGUE RECIPE CONTROL | | ENABLED | 1 | 0 |
| 3 LIFTER DOWN AT END OF WAFER INSTALLATION | | DISABLED | 1 | 0 |
| 3 INTER-WAFER PROCESS | | ENABLED | 1 | 0 |
| 4 GHOST COMMUNICATION ERROR LEVEL | | INFORMATION | 3 | 0 |
| | | | | |
| Group ItemName | | Value | Max | Min |
| 3 MAXIMUM PROCESS STEP TIME | [SECONDS] | 7200 | 99999 | 0 |
| 3 MINIMUM PROCESS STEP TIME | [SECONDS] | 0 | 99999 | 0 |
| 1 DEFAULT RECIPE USER CLASS NAME | | | | |
| 1 DEFAULT RECIPE NAME | | DEFAULT | | |
| 3 TEMPERATURE CONFIRMATION AT RECIPE START | | DISABLED | 1 | 0 |
| 3 WASTE GAS SWITCH TIME-OUT | [SECONDS] | 40 | 999 | 0 |
| 3 GAS VALVE CLOSE TIME-OUT | [SECONDS] | 10 | 100 | 0 |
| 3 CHAMBER VALVE OPEN AT RECIPE EXECUTION | | ENABLED | 1 | 0 |
| | | | | |
| Group ItemName | | Value | Max | Min |
| 3 MAXIMUM PRESSURE | [Torr] | 1.00E+02 | 3.6E+08 | 0 |
| 2 APC CONTROL PID DEFINITION (P) | | 30 | 99999 | 0 |
| 2 APC CONTROL PID DEFINITION (I) | | 10 | 99999 | 0 |
| 2 APC CONTROL PID DEFINITION (D) | | 0 | 99999 | 0 |
| 3 EVACUATION VALVE OPEN WAITING TIME | [SECONDS] | 10 | 9990 | 0 |
| 3 EVACUATION TIME-OUT | [SECONDS] | 1200 | 36000 | 0 |
| 3 EVACUATION VALVE OPERATION TIME-OUT | [SECONDS] | 5 | 600 | 0 |
| | | | | |
| Group ItemName | | Value | Max | Min |
| 2 SHOWER HEATER CONTROL | | ENABLED | 1 | 0 |
| 3 SHOWER HEATER OUT OF STABILIZATION ALARM TIME [SECONDS] | | 60 | 6000 | 0 |
| 3 SHOWER HEATER OUT OF STABILIZATION WARNING TIME [SECONDS] | | 10 | 6000 | 0 |
| 3 SHOWER HEATER PROGRAMMED TEMPERATURE COMPLETION, READY TIME [SECONDS] | | 300 | 6000 | 0 |
| 2 LAMP HEATER MAXIMUM SETTING TEMPERATURE | [°C] | 500 | 5000 | 0 |
| 2 LAMP HEATER MINIMUM SETTING TEMPERATURE | [°C] | 0 | 5000 | 0 |
| 2 REMOTE SHIFT TEMPERATURE MINIMUM VALUE | [°C] | -30 | 300 | -300 |
| 2 REMOTE SHIFT TEMPERATURE MAXIMUM VALUE | [°C] | 30 | 300 | -300 |
| 3 TEMPERATURE RAISING/LOWERING COMPLETION, SUSCEPTOR TEMPERATURE RANGE [°C] | | 10 | 1000 | 0 |
| 3 SUSCEPTER TEMPERATURE STABLE TIME | [SECONDS] | 5 | 600 | 0 |
| 3 LAMP HEATER INITIALIZING TEMPERATURE CONTROL | | DISABLED | 1 | 0 |
| 3 LAMP HEATER INITIALIZING SETTING DEFAULT TEMPERATURE | [°C] | 0 | 5000 | 0 |
| | : | : | : | : |

FIG.6

| | | | | | |
|---|---|---|---|---|---|
| RECIPE NAME | RRRR1 | | | | |
| CREATED DATE | 200Y/MM/DD 20:41:38 | | | | |
| UPDATED DATE | 200Y/MM/DD 22:36:40 | | | | |
| CREATOR | ADMIN | | | | |
| | | | | | |
| FIXED ITEMS | | | | | |
| STAGE TEMPERATURE [°C] | 400 | | | | |
| FILM THICKNESS [nm] | 0 | | | | |
| DUMMY LOOP SELECTION | Table01 | | | | |
| | | | | | |
| STEP ITEMS | 1 | 2 | 3 | 4 | ... |
| END CONDITION | TIME | TIME | TIME | TIME | ... |
| TIME [SEC.] | 10 | 15 | 10 | 90 | ... |
| COMMENT | Gas stab | Gas stab | Gas stab | Process | ... |
| PROCESS DATA FLAG | On | On | On | On | ... |
| TORELANCE TABLE | Table 01 | Table 02 | Table 02 | Table 02 | ... |
| LOOP STEP NUMBER | 0 | 0 | 0 | 0 | ... |
| LOOP [S] | 0 | 0 | 0 | 0 | ... |
| LIFTER PIN LOCATION | Process | Process | Process | Process | ... |
| PRESSURE [Pa] | 533.32 | 533.32 | 133.33 | 133.33 | ... |
| APC 2 ANGLE [deg] | -------- | -------- | -------- | -------- | ... |
| PRESSURE CONTROL | PRESSURE CONTROL | PRESSURE CONTROL | PRESSURE CONTROL | PRESSURE CONTROL | ... |
| L02:Ar FLOW VOLUME [SCCM] | 1500 | 500 | 500 | 500 | ... |
| L03:H2 FLOW VOLUME [SCCM] | 5 | 5 | 5 | 5 | ... |
| L07:O2 FLOW VOLUME [SCCM] | 5 | 5 | 5 | 5 | ... |
| L02:Ar FLOW MODE | AutoFlow | AutoFlow | AutoFlow | AutoFlow | ... |
| L03:H2 FLOW MODE | AutoFlow | AutoFlow | AutoFlow | AutoFlow | ... |
| L07:O2 FLOW MODE | AutoFlow | AutoFlow | AutoFlow | AutoFlow | ... |
| L02:Ar Ramp Up [SEC.] | 0 | 0 | 0 | 0 | ... |
| L03:H2 Ramp Up [SEC.] | 0 | 0 | 0 | 0 | ... |
| L07:O2 Ramp Up [SEC.] | 0 | 0 | 0 | 0 | ... |
| MICROWAVE OUTPUT [W] | 0 | 0 | 0 | 4000 | ... |
| OSCILLATION MODE | CW | CW | CW | CW | ... |
| PULSE FREQUENCY [kHz] | -------- | -------- | -------- | -------- | ... |
| DUTY RATION [%] | -------- | -------- | -------- | -------- | ... |
| PRESET CONTROL | On | Off | Off | Off | ... |
| TUNER LOCATION 1 [mm] | 0 | -------- | -------- | -------- | ... |
| TUNER LOCATION 2 [mm] | 0 | -------- | -------- | -------- | ... |
| | | | | | ... |
| TOLERANCE | | | | | ... |
| STAGE TEMPERATURE (STABLE CONDITION : TIME) [SEC.] | 0 | 5 | 5 | 5 | |
| ... | | | | | ... |
| PRESSURE (STABLE CONDITION : TIME) [SEC.] | 0 | 3 | 3 | 3 | |
| ... | | | | | ... |
| PROCESS GAS 2:Ar (STABLE CONDITION : TIME) [SEC.] | 0 | 3 | 3 | 3 | |
| : | : | : | : | : | : |

| DATE | TIME | WAFER NUMBER | PROCESS CONTENTS |
|---|---|---|---|
| 200Y/MM/DD | ... | ... | ... |
| 200Y/MM/DD | 17:44:11 | [1-01] | TRANSFER ARM CARRIED OUT FROM PROCESS CHAMBER 12A |
| 200Y/MM/DD | 17:44:12 | [1-05] | CARRIER ARM CARRIED OUT FROM CASSETTE CONTAINER |
| 200Y/MM/DD | 17:44:15 | [1-03] | TRANSFER ARM CARRIED OUT FROM LOAD LOCK CHAMBER 38A |
| 200Y/MM/DD | ... | ... | ... |
| 200Y/MM/DD | 17:44:29 | [1-04] | TRANSFER ARM CARRIED OUT FROM LOAD LOCK CHAMBER 38A |
| 200Y/MM/DD | 17:44:30 | [1-01] | TRANSFER ARM CARRIED IN PROCESS CHAMBER 12C |
| 200Y/MM/DD | 17:44:31 | [1-02] | TRANSFER ARM CARRIED OUT PROCESS CHAMBER 12B |
| 200Y/MM/DD | 17:44:32 | [1-05] | TRANSFER ARM CARRIED OUT FROM LOAD LOCK CHAMBER 38B |
| 200Y/MM/DD | 17:44:33 | [1-07] | CARRIER ARM CARRIED OUT FROM CASSETTE CONTAINER |
| 200Y/MM/DD | ... | ... | ... |
| 200Y/MM/DD | 17:44:40 | [1-01] | TRANSFER ARM CARRIED IN LOAD LOCK CHAMBER 38A |
| 200Y/MM/DD | 17:44:41 | [1-07] | TRANSFER ARM CARRIED IN LOAD LOCK CHAMBER 38B |
| ... | ... | | |

FIG. 8

| | | | | | | | | |
|---|---|---|---|---|---|---|---|---|
| 8924a | Module Name | PM2/SPA | | | | | | |
| 8924b | Wafer No. | [1-01] | | | | | | |
| 8924c | Recipe Name | A09RX_V01 | | | | | | |
| | User | ADMIN | | | | | | |
| 8924l | Lot Start Time | 200Y/MM/DD 15:38:44 | | | | | | |
| | Lot End Time | 200Y/MM/DD 17:00:11 | | | | | | |
| 8924m | Sampling Interval [sec.] | 1 | | | | | | |
| 8924d | Trace Start Time | 200Y/MM/DD 15:55:56 | | | | | | |
| 8924e | Trace End Time | 200Y/MM/DD 15:58:04 | | | | | | |

| Interval sec | Step | Chamber Pressure Pa | Stage Temperature degC | ... | Gas Flow2[Ar] SCCM | Gas Flow3[H2] SCCM | Gas Flow7[O2] SCCM | ... |
|---|---|---|---|---|---|---|---|---|
| 1 | 1 | 1.3 | 400 | ... | 0 | 0 | 0 | ... |
| 2 | 1 | 266.6 | 400 | ... | 1499.7 | 5 | 5 | ... |
| 3 | 1 | 533 | 400 | ... | 1499.7 | 5 | 5 | ... |
| 4 | 1 | 533 | 400 | ... | 1499.7 | 5 | 5 | ... |
| 5 | 1 | 533 | 400 | ... | 1499.7 | 5 | 5 | ... |
| 6 | 1 | 533 | 400 | ... | 1499.7 | 5 | 5 | ... |
| 7 | 1 | 533 | 400 | ... | 1499.7 | 5 | 5 | ... |
| 8 | 1 | 533 | 400 | ... | 1499.7 | 5 | 5 | ... |
| 9 | 1 | 533 | 400 | ... | 1499.7 | 5 | 5 | ... |
| 10 | 1 | 533 | 400 | ... | 1499.7 | 5 | 5 | ... |
| 11 | 2 | 533 | 400 | ... | 500.2 | 5 | 5 | ... |
| 12 | 2 | 533 | 400 | ... | 500.2 | 5 | 5 | ... |
| 13 | 2 | 533 | 400 | ... | 500.2 | 5 | 5 | ... |
| 14 | 2 | 533 | 400 | ... | 500.2 | 5 | 5 | ... |
| 15 | 2 | 533 | 400 | ... | 500.2 | 5 | 5 | ... |
| 16 | 2 | 533 | 400 | ... | 500.2 | 5 | 5 | ... |
| 17 | 2 | 533 | 400 | ... | 500.2 | 5 | 5 | ... |
| 18 | 2 | 533 | 400 | ... | 500.2 | 5 | 5 | ... |
| 19 | 2 | 533 | 400 | ... | 500.2 | 5 | 5 | ... |
| 20 | 2 | 533 | 400 | ... | 500.2 | 5 | 5 | ... |
| 21 | 2 | 533 | 400 | ... | 500.2 | 5 | 5 | ... |
| 22 | 2 | 533 | 400 | ... | 500.2 | 5 | 5 | ... |
| 23 | 2 | 533 | 400 | ... | 500.2 | 5 | 5 | ... |
| 24 | 2 | 533 | 400 | ... | 500.2 | 5 | 5 | ... |
| ... | ... | ... | ... | ... | ... | ... | ... | ... |

| DATE | TIME | WAFER NUMBER | PROCESS CONTENTS |
|---|---|---|---|
| 200Y/MM/DD | 8:46:12 | [1-01] | RELEASE |
| 200Y/MM/DD | 8:46:11 | [1-01] | PM3 TRANSFER IN CARRY-IN DISABLE STATE |
| 200Y/MM/DD | 8:52:56 | [1-02] | PM3 SHORTAGE OF DILUTION GAS FOR H2 |
| 200Y/MM/DD | 8:52:56 | [1-03] | MC0 CONTROLLER COMMUNICATION DISCONNECTION |
| 200Y/MM/DD | 10:04:25 | [1-01] | MC3 CONTROLLER COMMUNICATION DISCONNECTION |
| 200Y/MM/DD | 10:04:15 | [1-03] | MC0 CONTROLLER COMMUNICATION DISCONNECTION |
| 200Y/MM/DD | 10:04:15 | [1-04] | MC2 CONTROLLER COMMUNICATION DISCONNECTION |
| 200Y/MM/DD | 22:25:00 | [1-02] | MC0 CONTROLLER COMMUNICATION DISCONNECTION |
| 200Y/MM/DD | 22:24:50 | [1-01] | MC3 CONTROLLER COMMUNICATION DISCONNECTION |
| 200Y/MM/DD | 22:24:50 | [1-02] | RELEASE |
| 200Y/MM/DD | 22:24:24 | [1-01] | RELEASE |
| 200Y/MM/DD | 22:24:16 | [1-01] | PM3 CANCEL RECIPE PROCESS |
| 200Y/MM/DD | 22:24:03 | [1-03] | PM3 CANCEL RECIPE PROCESS |
| 200Y/MM/DD | 22:24:03 | [1-05] | PM2 CANCEL RECIPE PROCESS |
| 200Y/MM/DD | 22:23:54 | [1-02] | PM2 CANCEL RECIPE PROCESS |
| 200Y/MM/DD | 22:23:54 | [1-01] | PM3 TRANSFER IN CARRY-IN DISABLE STATE |
| 200Y/MM/DD | 22:23:05 | [1-01] | P3 LOWER THAN PEEK OUTPUT VALUE OF MICROWAVE |
| 200Y/MM/DD | 22:23:05 | [1-01] | RELEASE |
| .. | .. | .. | .. |

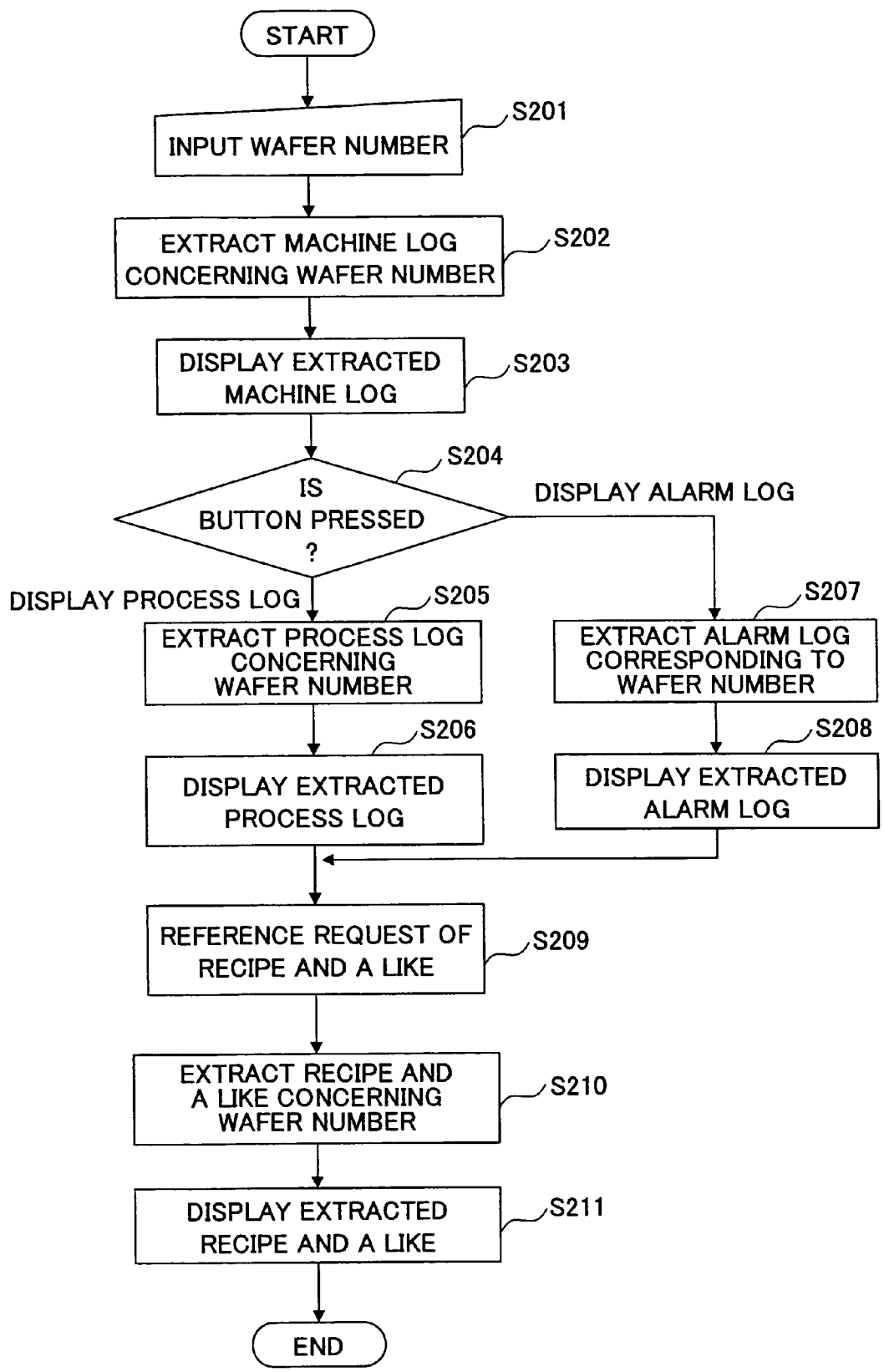

SUBSTRATE PROCESSING APPARATUS, HISTORY INFORMATION RECORDING METHOD, HISTORY INFORMATION RECORDING PROGRAM, AND HISTORY INFORMATION RECORDING SYSTEM

BACKGROUND OF THE INVENTION

1. Field of the Invention

The present invention generally relates to substrate processing apparatuses, history information recording methods, history information recording program, and history information recording system, and more specifically to the substrate processing apparatus including a plurality process chambers for processing a substrate and a transferring part for carrying in and carrying out the substrate, the history information recording method, the history information recording program for the substrate processing apparatus to execute the history information recording method, and the history information recording system.

2. Description of the Related Art

In order to determine a cause when a problem occurs in a computer system, the computer system generally records a log concerning a process conducted by the computer system. Similarly, a substrate processing apparatus such as a semiconductor fabricating apparatus, and a like records various logs concerning a semiconductor fabricating process. However, when a defective product is produced, an operator traces the cause of the problem by examining the various logs.

However, conventionally, the substrate processing apparatus records the various logs in viewpoints of various sides of handling the substrate (that is, a carrier arm, a process chamber, and a like). That is, the substrate processing apparatus chronologically records information concerning a plurality of substrates and indicating an operation which is conducted or a process conducted in a process chamber in a mixed form.

However, in a case in that the defective product is produced, it is quite complicated even for an experienced operator to inspect what transfer or process is conducted for a specific substrate causing the defective product, and what alarm occurs.

Moreover, each of various logs is separately created and managed. This circumstance further makes it difficult to inspect the cause of the defective product.

SUMMARY OF THE INVENTION

It is a general object of the present invention to provide a substrate processing apparatus, a history information recording method, a history information recording program, and a history information recording system, in which the above-described problems are eliminated.

A more specific object of the present invention is to provide the substrate processing apparatus, the history information recording method, the history information recording program, and the history information recording system, which can reduce a workload concerning a cause investigation work with respect to a problem causing a defective product.

The above objects of the present invention are achieved by a substrate processing apparatus including a plurality of process chambers for processing a substrate and a transfer part for carrying in and carrying out the substrate to and from the plurality of process chambers, said substrate processing including: a transfer history recording part relating history information concerning a transfer of the substrate by the transfer part to each substrate, and recording the history information concerning the transfer of the substrate as first history information; a process history recording part relating history information concerning a process state of the substrate in each of the plurality of process chambers to each substrate subject to be processed, and recording the history information concerning the process state as second history information; and an alarm history recording part relating history information concerning an alarm occurred in at least one of the transfer part and the process chambers to each substrate, and recording the history information concerning the alarm as third history information.

In the substrate processing apparatus according to the present invention, it is possible to accumulate various log information by relating to each substrate. Accordingly, it is possible to reduce workload concerning tracing a cause of an error or a like.

The above objects of the present invention can be achieved by a history information recording method performed by the substrate processing apparatus, a history information recording program causing the substrate processing apparatus to conduct the history information recording method, and a history information recording system for controlling the substrate processing apparatus.

BRIEF DESCRIPTION OF THE DRAWINGS

Other objects, features and advantages of the present invention will become more apparent from the following detailed description when read in conjunction with the accompanying drawings, in which:

FIG. 5 is a diagram partially showing a parameter example according to the embodiment of the present invention;

FIG. 6 is a diagram partially showing a recipe example according to the embodiment of the present invention;

FIG. 7 is a diagram partially showing a machine log example according to the embodiment of the present invention;

FIG. 8 is a diagram partially showing a process log example according to the embodiment of the present invention;

FIG. 9 is a diagram partially showing an alarm log example according to the embodiment of the present invention;

FIG. 10 is a flowchart for explaining a process procedure of a displaying process of the log information according to the embodiment of the present invention;

DETAILED DESCRIPTION OF THE PREFERED EMBODIMENTS

A description will now be given, with reference to FIG. 1 through FIG. 5, of embodiments of the present invention.

First Embodiment

Figure 1:
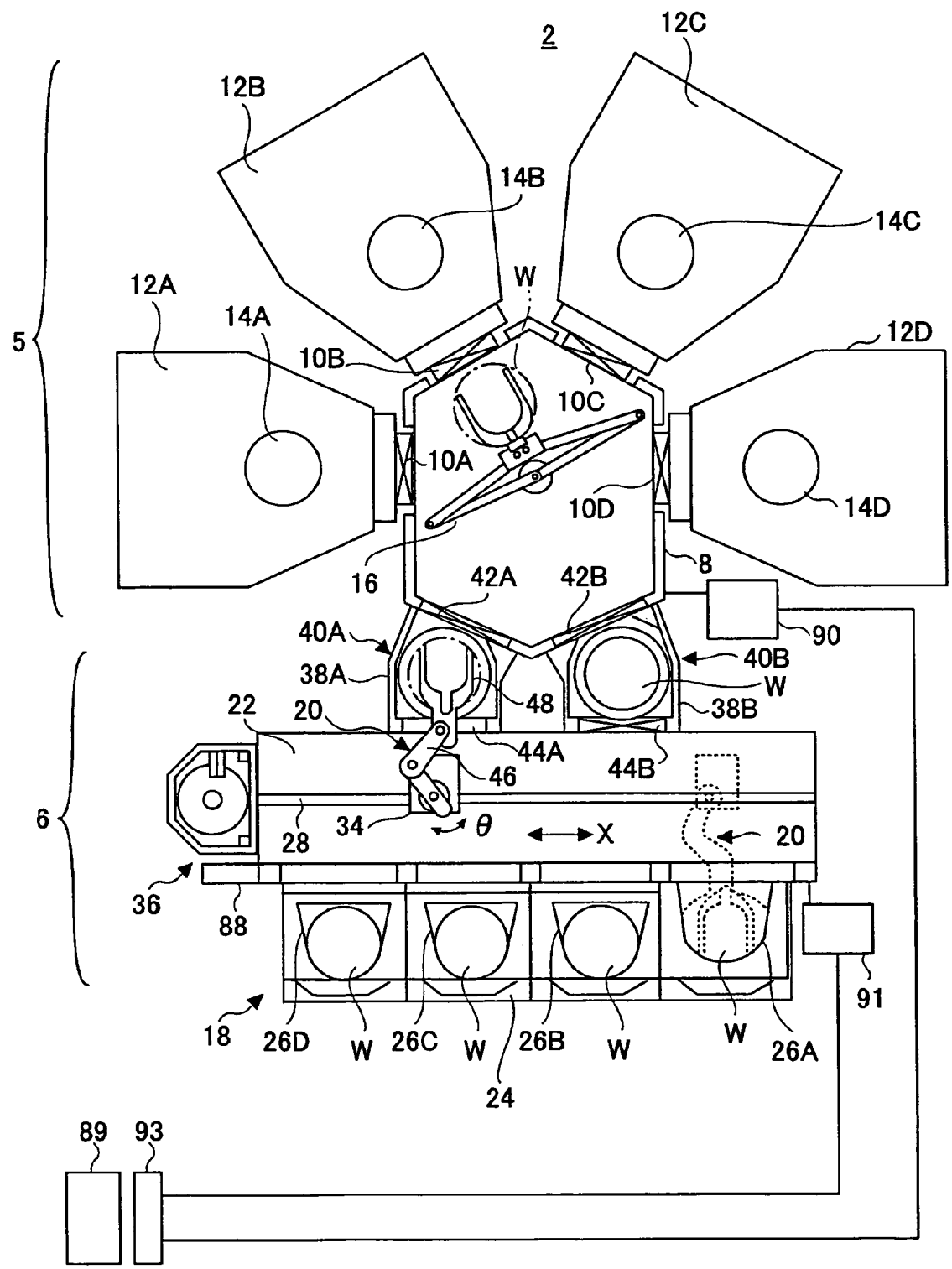
FIG. 1 is a schematic diagram showing a configuration example of a substrate processing apparatus according to an embodiment of the present invention.

FIG. 1 is a schematic diagram showing a first configuration of a substrate processing apparatus according to an embodiment of the present invention. In FIG. 1, the substrate processing apparatus 2 mainly includes a processing system 5 for conducting various processes such as a coating process, a diffusion process, an etching process, and a like with respect to a semiconductor wafer (substrate) W that is conveyed through the various processes, and a transferring system 6 for carrying in and carrying out the wafer W with respect to the processing system 5. The processing system 5 includes a transfer chamber 8 which can be evacuated under vacuum, and process chambers 12A through 12D that are coupled through gate valves 10A through 10D. The processing system 5 conducts the same or different types of heating processes with respect to the wafer W in each of the process chambers 12A through 12D. In each of the process chambers 12A through 12D, susceptors 14A through 14D are respectively arranged to mount the wafer W. In addition, in the transfer chamber 8, a transfer arm part 16 is arranged, and the transfer arm part 16 can flexibly bend, stretch, and swivel, and carries in and out the wafer W among the process chambers 12A through 12D and among load lock chambers, which will be described later.

On the other hand, the transferring system 6 includes a cassette stage 18 for loading a cassette container, and a transfer stage 22 for carrying the wafer W and moving a carrier arm part 20 to transfer and receive the wafer W. In the cassette stage 18, a container loading stand 24 is arranged, and can load a plurality of cassette containers, for example, four cassette containers 26A through 26D at maximum in FIG. 1. Each of the cassette containers 26A through 26D can load and accommodate wafers W, for example, 25 wafers W at maximum, at pitch on multi-stages. In the transfer stage 22, a guide rail 28 extending along a central part of the transfer stage 22 in a longitudinal direction is arranged. The carrier arm part 20 is supported to be capable of sliding on the guide rail 28.

Moreover, at another edge of the transfer stage 22, an orienter 36 is arranged as an orientation determination apparatus for orientating a wafer. Furthermore, in the middle of the transfer stage 22, in order to couple with the transfer chamber 8, two load lock chambers 38A and 38B, which can be evacuated under vacuum, are arranged. In each of the load lock chambers 38A and 38B, loading stages 40A and 40B are arranged to load the wafer W. In addition, before and after the load lock chambers 38A and 38B, gate valves 42A and 42B, and 44A and 44B are arranged to communicate to the transfer chamber 8 or the transfer stage 22. In the substrate processing apparatus 2, at least the transfer arm part 16 and the carrier arm part 20 form a transferring part.

The substrate processing apparatus 2 further includes a system controller for controlling operations of the processing system 5, the transferring system 6, and the like, and an operation controller 88 arranged at one edge of the transfer stage 22.

For example, the operation controller 88 includes a display part including an LCD (Liquid Crystal Display), which displays each operation state of the substrate processing apparatus 2, log information that will be described later, and a like.

Figure 2:
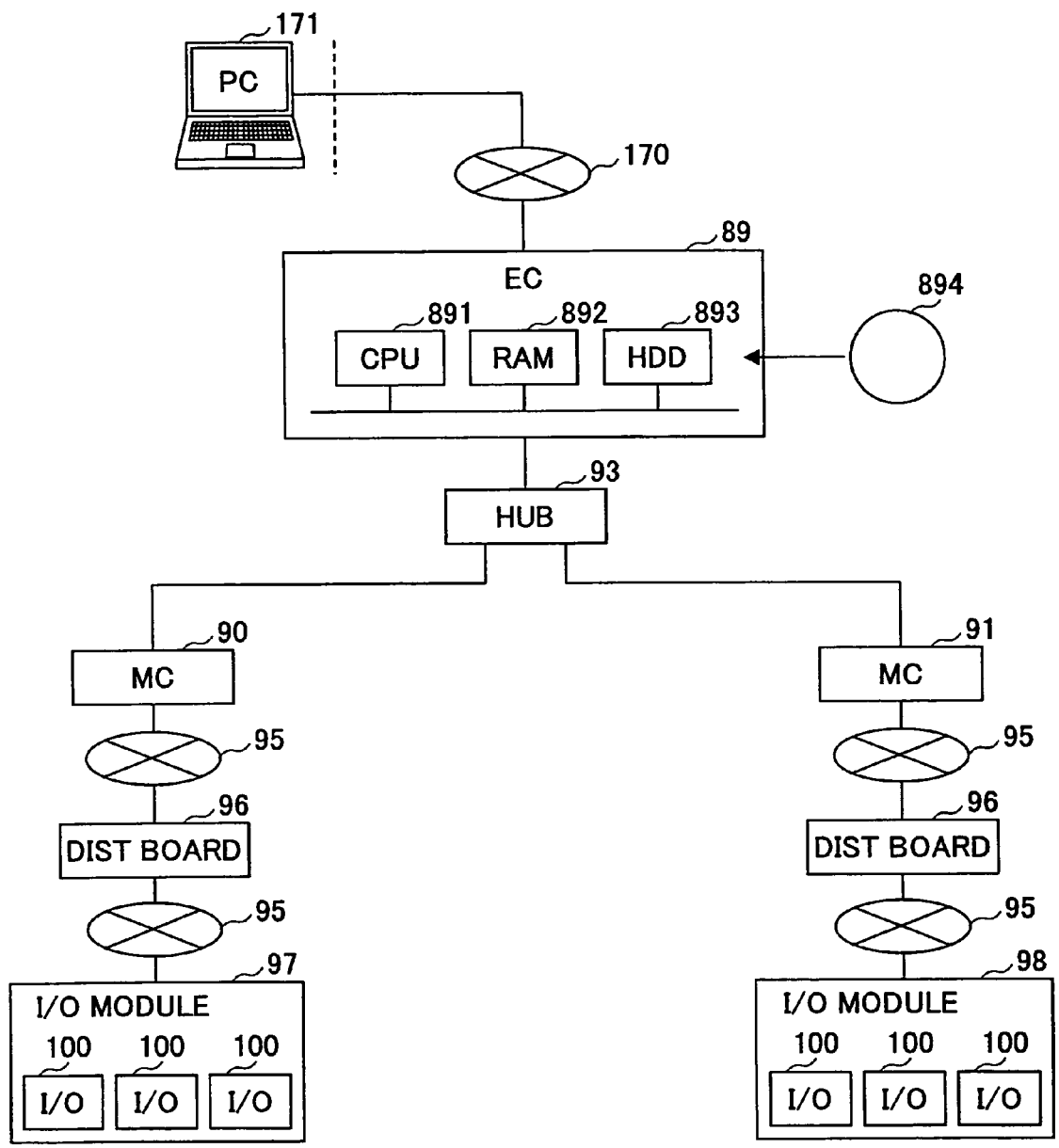
FIG. 2 is a diagram showing a configuration example of a system controller according to the embodiment of the present invention.

FIG. 2 is a diagram showing a configuration example of the system controller according to the embodiment of the preset invention. In FIG. 2, the system controller includes an EC (Equipment Controller) 89, two MCs (Module Controllers) 90 and 91, and a switching hub 93 for connecting the EC 89 to each of the MCs 90 and 91. The system controller is connected to a PC 171 acting as a MES (Manufacturing Execution System) for managing fabricating processes of the entire plant where the substrate processing apparatus 2 is arranged, through a LAN (Local Area Network) 170. The MES feeds back real time information concerning processes in the plant to a basic operation (not shown), and also conducts a determination concerning processes by considering a workload of the entire plant.

The EC 89 is a main control part (master control part) for controlling an operation of the entire substrate processing apparatus 2 totalizing all MCs 90 and 91. In addition, the EC 89 includes a CPU 891, a RAM (Random Access Memory) 892, an HDD (Hard Disk Drive) 893, and a like. In the EC 89, the CPU 891 controls the operations of the processing system 5, the transferring system 6, and the like by sending a control signal to each of MCs 90 and 91 in accordance with a process method of the wafer W indicated by a user or a like through the operation controller 88, that is, a program corresponding to a recipe. Also, the EC 89 accumulates log information based on information detected by various sensors (not shown) arranged to the processing system 5 and the transferring system in the HDD 893.

The switching hub 93 switches to the MC 90 or 91 to connect based on the control signal sent from the EC 89.

The MC 90 is one sub-control part (slave control part) for controlling the operations of the processing system 5, and the MC 91 is another sub-control part (slave control part) for controlling the operation of the transferring system 6. The MCs 90 and 91 are connected to I/O (Input/Output) modules 97 and 98 through GHOST networks 95 by DIST (DISTribution) boards 96, respectively. Each of the GHOST networks 95 is a network realized by an LSI called GHOST (General High-Speed Optimum Scalable Transceiver) mounted on an MC board included in each of the MCs 90 and 91. Thirty one I/O modules can be connected at maximum to the GHOST network 95. In the GHOST networks 95, the MCs 90 and 91 correspond to masters, and the I/O modules 97 and 98 correspond to slaves.

The I/O module 97 includes a plurality of I/O parts 100 connected respectively to component elements (hereinafter, called "end devices") in the processing system 5. The I/O module 97 controls the control signal to each of the end devices and an output signal sent from each of the end devices. In the I/O module 97, for example, an MFC of an ammonia gas supply-pipe, an MFC of a hydrofluoric acid gas supply-pipe, a pressure gauge, an APC (Automatic Pressure Control) valve, a nitrogen gas supply-pipe, and the transfer arm part 16 of the transfer chamber 8, and the like correspond to the end devices connected to the I/O part 100, for the process chambers 12A through 12D.

It should be noted that the I/O module 98 has the same configuration as the I/O module 97, and a connection configuration between the I/O module 98 and the transferring system 6 has the same as the connection configuration of the MC 90 and the I/O module 97 as described above, and explanation thereof will be omitted.

In addition, an I/O board (not shown) for controlling to input and output a digital signal, an analog signal, and a serial signal in the I/O part 100 is connected to each of the GHOST networks 95.

In the substrate processing apparatus 2, when a predetermined process is conducted with respect to the wafer W, in accordance with a program corresponding to the recipe of the predetermined process, the CPU 891 of the EC 89 executes the predetermined process in the process chamber 12A or the like, by sending the control signal to a desired end device through the I/O part 100 in the switching hub 93, the MC 90, the GHOST network 95, and the I/O module 97.

In the system controller in FIG. 2, instead of connecting a plurality of end devices to the EC 89, each of the I/O parts 100 connected to the plurality of end devices are modularized and the I/O parts 100 form the I/O modules 97 and 98. Since the I/O modules 97 and 98 are connected to the EC 89 through the MCs 90 and 91 and the switching hub 93, a communication system can be simplified.

In addition, the control signal sent from the CPU 891 of the EC 89 includes an address of the I/O part 100 connected to the desired end device, and an address of the I/O module 97 or 98 including the I/O part 100. The switching hub 93 refers to the address of the I/O module 97 or 98 included in the control signal, and refers to the address of the I/O part 100 in a GHOST control signal of the MC 90 or 91. Hence, it is not required for the switching hub 93 and the MCs 90 and 91 to inquire a sender of the control signal to the CPU 891. Therefore, it is possible to realize a smooth communication by the control signal.

Figure 3:
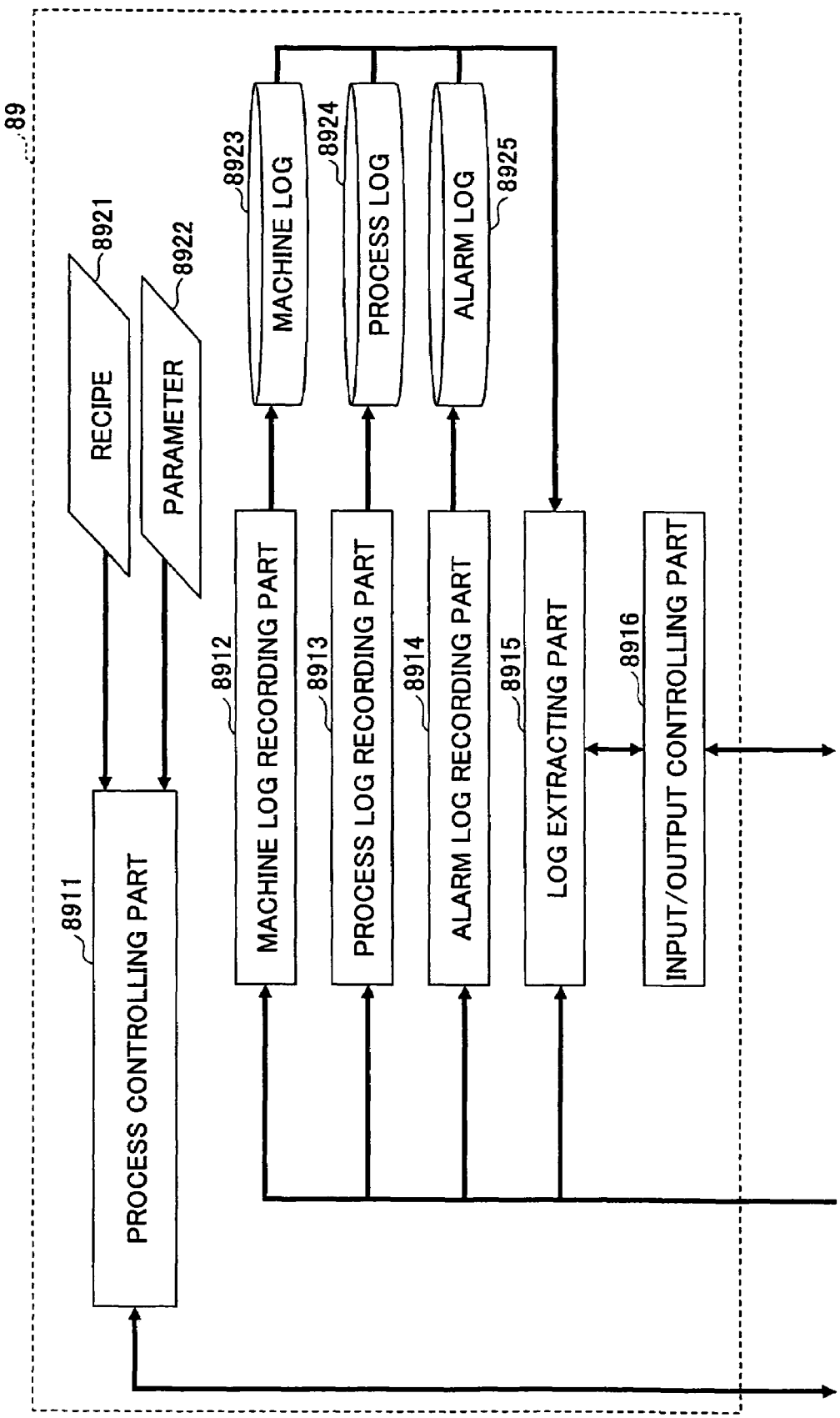
FIG. 3 is a diagram for explaining a functional configuration example concerning a log process function in an EC according to the embodiment of the present invention.

FIG. 3 is a diagram for explaining a functional configuration example concerning a log process function in the EC 89 according to the embodiment of the present invention. In FIG. 3, the EC 89 includes a process control part 8911, a machine log recording part 8912, a process log recording part 8913, an alarm log recording part 8914, a log extracting part 8915, and an input/output controlling part 8916. The CPU 891 can realize various functions by executing programs stored in the HDD 893. For example, the programs may be installed from a recording medium such as a CD-ROM 894 (FIG. 2) or through a network or a like. Alternatively, the programs may be built into the EC 89 when the EC 89 is shipped.

The process control part 8911 controls the operations of the processing system 5, the transferring system 6, and the like of the substrate processing apparatus 2, based on a recipe 8921 and a parameter 8922 which are stored in the HDD 893 beforehand.

The machine log recording part 8912, the process log recording part 8913, the alarm log recording part 8914, and the like are functions for recording log information to the HDD 893, based on information detected by various sensors arranged in the processing system 5 or the transferring system 6 of the substrate processing apparatus 2.

That is, the machine log recording part 8912 records a machine log 8923, the process log recording part 8913 records a process log 8924, and the alarm log recording part 8914 records an alarm log 8925, respectively. The machine log 8923 records data in which history information concerning a transfer of the wafer W in the substrate processing apparatus 2 is recorded in time series. The process log 8924 is data recorded for each process state in a case in that the wafer W is processed in each of the process chambers 12A through 12D, for example, data indicating history information such as a pressure, a temperature, and a gas flow rate is recorded for each wafer W, and the process log 8924 is also data recorded for each of process chambers 12A through 12D. The alarm log 8925 is data in which history information concerning an alarm which occurs when an error is caused in the substrate processing apparatus 2.

The input/output control part 8916 has a function of conducting a process control based on an input by an operator with respect to the operation controller 88, a display control with respect to the operation controller 88, and a like. The log extracting part 8915 has a function of searching for or extracting log information desired by the operator, in response to an instruction or a like from the input/output controlling part 8916. The log information extracted by the log extracting part 8915 is processed by the input/output control part 8916 to be display information, and is displayed at the operation controller 88.

Figure 4:
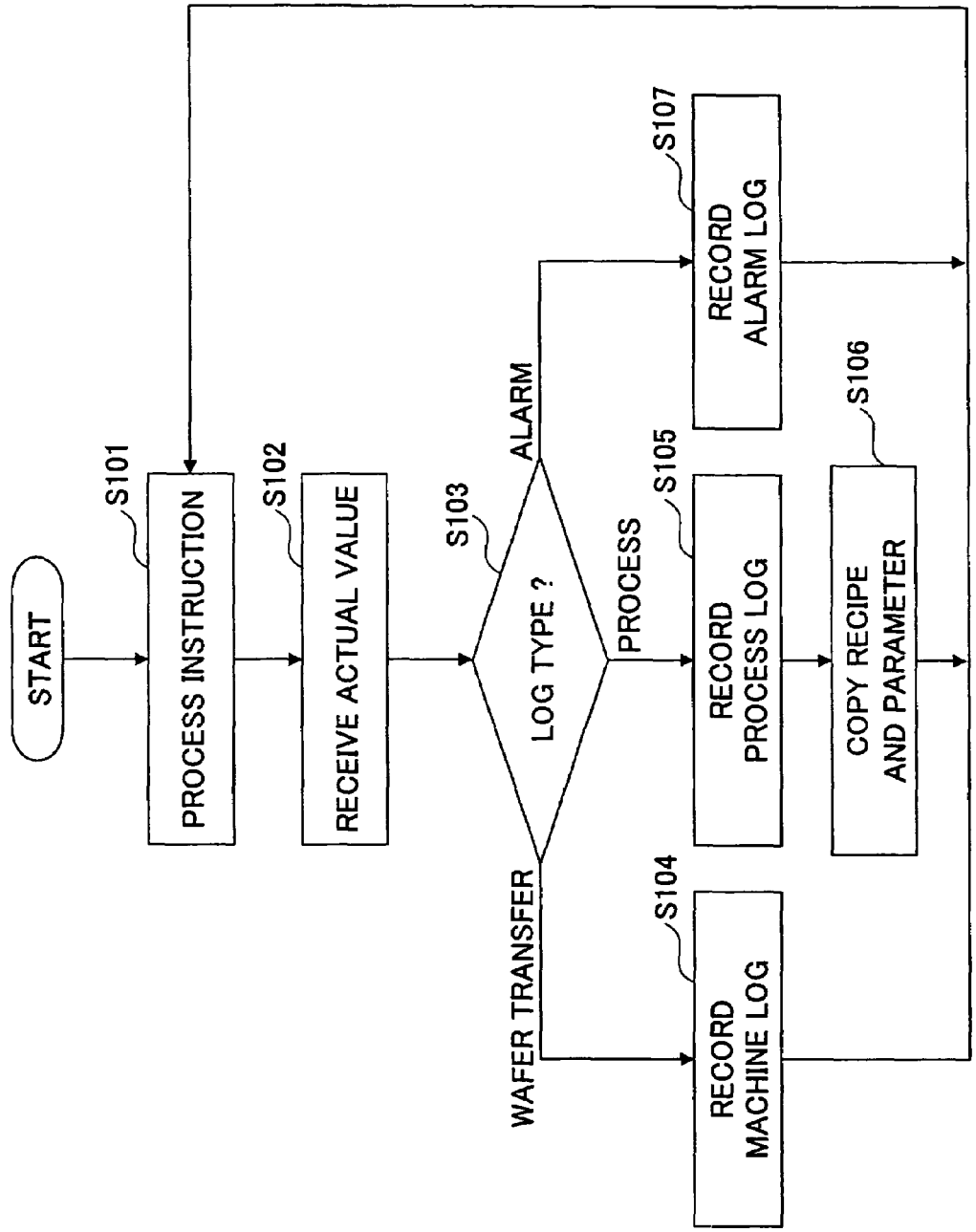
FIG. 4 is a flowchart for explaining a process procedure of a recording process of the log information according to the embodiment of the present invention.

In the following, a process procedure conducted by the EC 89 in FIG. 3 will be described. FIG. 4 is a flowchart for explaining a process procedure of a recording process of the log information.

In step S101, the process controlling part 8911 outputs a process instruction with respect to the processing system 5 and the transferring system 6 of the substrate processing apparatus 2 based on the recipe 8921 and the parameter 8922.

FIG. 5 is a diagram partially showing the parameter 8922. The parameter 8922 mainly includes information in which values are set for items defining a maintenance type, maintenance timing, and a maintenance method, items concerning ON/OFF of each function of the substrate processing apparatus 2, items for management information concerning the recipe 8921, items concerning an alarm to specify a case when an alarm is occurred, and a like.

For example, the management information concerning the recipe 8921 includes various items to set a maximum process step time, a minimum process step time, a temperature confirmation at a recipe start, seconds for waste gas switch time-out, seconds for gas valve close time-out, a chamber valve open at recipe execution, and a like.

For example, process instructions are sequentially output by the process controlling part 8911, to conduct processes such that a wafer W is carried out from the cassette container 26A or the like, the wafer W carried out from the cassette container 26A or the like is loaded to the orienter 36, the orienter 36 positions a position of the wafer W, the wafer W is carried out from the orienter 36, the wafer W carried out from the orienter 36 is carried into the load lock chamber 38A or 38B, the wafer W carried in the load lock chamber 38A or 38B is carried out again after being processed by the process chambers 12A through 12D, and the wafer W is loaded back to the cassette container 26A or the like where originally loaded. The above process instructions mainly appear as operations of the carrier arm part 20. In addition, other process instructions are sequentially output to conduct processes such that a wafer W is carried out from the load lock chamber 38A or 38B, the wafer W carried out from the load lock chamber 38A or 38B is carried in one of the process chambers 12A through 12D, the wafer W is carried out from the process chamber 12A or the like, the wafer W carried out from the process chamber 12A or the like is carried in another one of the process chamber 12B through 12D or the load lock chamber, and the like. The above process instructions mainly appear as operations of the transfer arm part 16. Moreover, as other process instructions, the control instructions of the process with respect to the process chambers 12A through 12D, and the like are sequentially output. The control instructions with respect to the process chamber 12A and the like are sequentially output based on the recipe 8921.

The recipe 8921 is process information concerning a substrate process of each of the process chambers 12A through 12D. In detail, the recipe 8921 is a process program specific for each of the process chambers 12A through 12D in order to control the process with respect to the wafer W, and the process program relates to a process sequence and control items (control target values of a temperature, a pressure, a type of gas, a gas flow rate, time, and a like).

FIG. 6 is a diagram partially showing the recipe 8921. The recipe 8921 in FIG. 6 records a recipe name 3921a for identifying each recipe, a created date 8921b, an updated date 8921c, and a like. The created date 8921b and the update date 8921c are items necessary to record since contents of the recipe 8921 may be updated.

In step items 8921d, step numbers are indicated to form a process sequence by the recipe 8921. In FIG. 6, steps 1 through 4 are shown. In practice, a larger number of steps may be indicated. Moreover, in a time 8921e, a required time is indicated for each step. In the following to the time 8921e, values for various control items are indicted for each step.

That is, when the process control part 8911 outputs values of the control items for each steps based on the recipe 8921, various processes are executed in the process chamber 12A or the like.

The process controlling part 8911 specifies the wafer W subject to be processed by the process instruction using identification information (hereinafter, called a "wafer number") uniquely identifying each wafer W. The wafer number may be defined based on a location of the wafer W in the cassette container 26A or the like.

The recording process of the log information advances to step S102 after the step S101, an actual measurement concerning a process executed in the substrate processing apparatus 2 in response to the process instruction by the process controlling part 8911 is received by the machine log recording part 8912, the process log recording part 8913, or the alarm log recording part 8914.

For example, in a case of "WAFER TRANSFER" in step S103, the machine log recording part 8912 receives and records as the machine log 8923 information indicating the actual measurement concerning a transfer of the wafer W, that is, indicating states actually conducted such that the wafer W is carried out from the cassette container 26A or the like, the wafer W carried out from the cassette container 26A or the like is loaded to the orienter 36, the wafer W is positioned by the orienter 36, the wafer W is carried out from the orienter 36, the wafer W carried out from the orienter 36 is carried into the load lock chamber 38A or 38B, the wafer W carried into the load lock chamber 38A or 38B is carried out, the wafer W carried out from the load lock chamber 38A or 38B is carried in one of the process chambers 12A through 12D, the wafer W carried out from the load lock chamber 38A or 38B is carried out from one of the process chambers 12A through 12D, the wafer W carried out from one of the process chambers 12A through 12D is carried in another one of the process chambers 12A through 12D or in one of the load lock chambers 38A and 39B, the wafer W carried in the load lock chamber 38A or 39B is carried out, the wafer W carried out from the load lock chamber 38A or 39B is loaded in the cassette container 26A or the like in which the wafer W is originally loaded, and the like. In addition to the information as the machine log 8923, the machine log recording part 8912 receives and records also receives and records an executed time for each state, and the wafer number of the wafer W subject to be processed, by corresponding to the information as the machine log 8923 (step S104).

FIG. 7 is a diagram partially showing the machine log 8923. In the machine log 8923 in FIG. 7, a transfer history is recorded in time series for each wafer W, and each transfer history includes items of a date and time when the wafer W is transferred, a wafer number of the wafer W subject to be transferred, process contents, and a like. By recording the wafer number in the machine log 8923, each transfer history is related to a relative wafer W. That is, it is possible to easily extract all transfer histories by specifying the wafer W by using the wafer number as a key.

Moreover, in a case of "PROCESS" in step S103, the actual measurement based on the process conducted by each of the process chambers 12A through 12D and the like are received and recorded as the process log 8924 by the process log recording part 8913 (S105). That is, as the actual measurement, the process log recording part 8913 records a temperature, a pressure, a gas flow rate, identification information for identifying the process chamber, a wafer number of the wafer W subject to be processed, with respect to each of the process chambers 12A through 12D and the like during the respective process. In this case, the process log recoding part 8913 generates copies of the recipe 8921 and the parameter 8922 based on which the process is conducted, and stores the copies of the recipe 8921 and the parameter 8922 by associating the copies with the wafer W subject to be processed. For the parameter 8922, the copy may be entirely stored in the HDD 893. Alternately, a part of the copy related to management information concerning the recipe 8921 may be stored in the HDD 893.

FIG. 8 is a diagram partially showing the process log 8924. In FIG. 8, the process log 8924 is a process log with respect to a single wafer W in a single process chamber, and records a module name 8924a as identification of the process chamber, a wafer number 8924b of the wafer W subject to be processed, a recipe name 8924c, a lot start time 8924l, a lot end time 8924m, a trace start time 8924d for a start of recording a log, a trace end time 8924e for an end of recording the log, and a like.

Moreover, a process log record table 8924f records a history at intervals of a second for each actual measurement. That is, an elapsed time is recorded by the second at a column 8924g, and a step number of a step (defined in the recipe 8921) executed at that second time is recorded at a column 8924h. Moreover, at the same second time, a pressure is recorded at a column 8924i, a temperature is recorded at a column 8924j, a gas flow rate is recorded at a column 8924k, and a like, respectively. In practice, information is further recorded but is omitted for the sake of convenience. By recording the wafer number in the process log 8924, each process log record table 8924f can be related to a relative wafer W. Alternatively, for example, a relationship between the recipe 8921 and the relative wafer W and a relationship between the parameter 8922 and the relative wafer W can be made by additionally providing the wafer number to a file name of each of the recipe 8924 and the parameter 8922 after each of the recipe 8924 and the parameter 8922 is copied.

In this case shown in FIG. 8, a process time is approximately one hour and 20 minutes from the lot start time 8924*l* and the lot end time 8924*m*. On the other hand, as seen from the trace start time 8924*d* and the trace end time 8924*e*, a log recording time is approximately 2 minutes. That is, for the process log 8924 in FIG. 8, it is not necessary to record details of operations concerning a single lot. The process log 8924 may be recorded for a necessary unit (each operation). A recording time for a single process log 8924 is approximately within five minutes, and approximately 120 seconds is preferable.

Furthermore, in a case of "ALARM" in step S103, the alarm log recording part 8914 receives alarm information based on an error or a like which occurs in the processing system 5 and the transferring system 6 in the substrate processing apparatus 2, and the wafer number of the wafer W concerning the alarm, and records the alarm information and the wafer number as the alarm log 8925 (step S106).

FIG. 9 is a diagram partially showing the alarm log 8925. In the alarm log 8925 in FIG. 9, histories of the alarms which occur are shown in a time series, and each of the histories includes a date and time when an alarm occurs, a wafer number of a wafer W being alarmed, contents of the alarm, and a like. Each alarm is related to a relative wafer W by recording the wafer number in the alarm log 8925. That is, it is possible to easily extract all histories by specifying the wafer W by using the wafer number as a key.

As described above, by repeating the steps S101 through S107, the machine log 8923, the process log 8924, the alarm log 8925, and the like are accumulated in the HDD 893.

Subsequently, a process, which is conducted when a request for displaying log information accumulated in the recording process of the log information in FIG. 4, will be described. FIG. 10 is a flowchart for explaining a process procedure of a displaying process of the log information.

In step S201, an operator inputs the wafer number of the wafer W of which log information is referred to, to the operation controller 88. The wafer number may be input from a keyboard. Alternatively, the input/output controlling part 8916 of the EC 89 controls the operation controller 88 to display a list of the wafer numbers, and has the operator to select one of the wafer numbers. In addition, the operator may be allowed to input a plurality of wafer numbers.

The displaying process of the log information advances to step S202 after the step S201. The input/output controlling part 8916 receives the wafer number (hereinafter, called a current wafer number) input by the operator, and sends the current wafer number to the log extracting part 8915. Then, the log extracting part 8915 checks the current wafer number with the wafer numbers recorded in the machine log 8923, and extracts only machine log information concerning the current wafer number from the machine log 8923. It should be noted that when the plurality of wafer numbers are input, the machine log information is extracted for each of the plurality of wafer numbers.

The displaying process of the log information advances to step S203 after the step S202. The input/output controlling part 8916 controls the operation controller 88 to display the machine log information extracted in the step S202. For example, the operation controller 88 displays the machine log information extracted in the step S202 at a screen as shown in FIG. 11.

Figure 11:
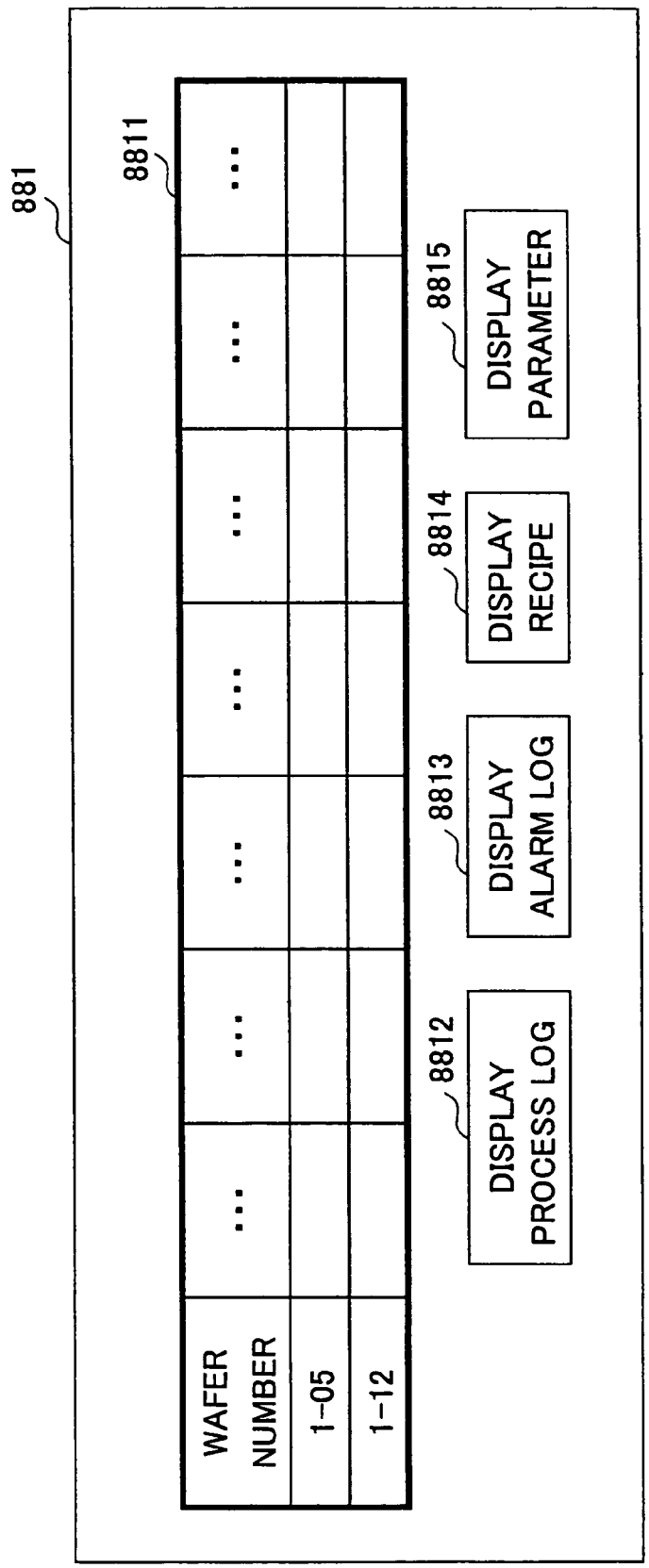
FIG. 11 is a diagram showing a display screen example of the machine log according to the embodiment of the present invention.

FIG. 11 is a diagram showing a display screen example of the machine log information. In FIG. 11, a machine log display screen 881 includes a machine log display area 8811, a process log display button 8812, an alarm log display button 8813, a recipe display button 8814, a parameter display button 8815, and a like.

The machine log display area 8811 is an area in which the machine log information of the wafer W is displayed for each wafer number input by the operator in a time series. In FIG. 11, each of the machine log information of one wafer W specified by the wafer number and the machine log information of another wafer W specified by "1-05" and "1-12" is displayed in a time series. For example, in a case in that one wafer W is not a defective product and another wafer W is a defective product, the operator can presume a cause of the defective product by confirming a different factor between both wafers W. Also, in a case in that both wafers W are defective products, the operator can presume a cause of the defective products by confirming a common factor between both wafers W. It should be noted that the different factor or the common factor can be displayed with highlight to improve visibility.

The process log display button 8812 is a button for displaying a process log corresponding to the wafer number (hereinafter, called a selected wafer number) selected in the machine log display area 8811. Moreover, the alarm log display button 8813 is a button for displaying alarm log information corresponding to the selected wafer number.

That is, in a case of "DISPLAY PROCESS LOG", when the process log display button 8812 is pressed, the log extracting part 8915 checks the selected wafer number with the wafer numbers recorded within the process log 8924, and extracts only process log information concerning the selected wafer number from the process log 8924 (step S205). The input/output controlling part 8916 sends the process log information extracted from the process log 8924 to the operation controller 88, and the process log information is displayed by the operation controller 88 (step S206).

On the other hand, in a case of "DISPLAY ALARM LOG" in step S204, when the alarm log display button 8813 is pressed by the operator, the log extracting part 8915 checks the selected wafer number with the wafer numbers recorded within the alarm log 8925, and extracts only alarm log information concerning the selected wafer number from the alarm log 8925 (step S207). The input/output controlling part 8916 sends the alarm log information extracted in the step S207 to the operation controller 88, and the operation controller 88 displays the alarm log information (step S208).

Furthermore, when the recipe display button 8814 or the parameter display button 8815 is pressed by the operator (step S209), for example, the log extracting part 8915 checks the selected wafer number with the file names of the copied recipe and the copied parameter stored in the HDD 893, and extracts recipe information and parameter information concerning the selected wafer number from the copied recipe and the copied parameter stored in the HDD 893 (step S210). The input/output controlling part 8915 sends the recipe information and the parameter information extracted in the step S210 to the operation controller 88, and the operation controller displays the recipe information and the parameter information (step S211).

As described above, in the substrate process apparatus according to the present invention, it is possible to easily refer to various log information for each wafer W. Accordingly, it is possible to reduce a workload to trace the cause of the defective product and the like more than a case of referring to the log information mixing various information concerning the plurality of wafers W in a time series.

In practice, contents of the recipe 8921 and the parameter 8922 are changed several times if necessary to update or improve. In the substrate processing apparatus 2 according to the embodiment of the present invention, contents of the recipe 8921 and the parameter 8922 actually used to operate the processes are copied and stored in the HDD 894. Therefore, when the cause of the defective product is inspected, the contents of the recipe 8921 and the parameter 8922, which are actually used, are referred to as the recipe information and the parameter information with various log information such as the machine log information, the process log information, and the alarm log information, as described above. Consequently, it is possible to precisely inspect the cause of the defective product.

Moreover, regarding the alarm which is effective information to trace the cause of the defective product, the alarm information is stored by relating to the respective wafer W, and can be extracted and referred for each of the wafers W. Accordingly, it is possible to effectively trace the cause of the defective product.

As described above, an example case of relating each of various log information to each of the wafer W by using the wafer number is explained. However, the various log information may not be related to the wafer W. For example, in a case of recording the log information, the log information may be recorded for each of the wafers W. That is, instead of recording the log information for each log type (each type of the machine log 8923, the process log 8924, and the alarm log 8925), a log file may be created so that various log information is recorded for each wafer W. Moreover, in a case of managing the log information by an RDB (Relational DataBase), for example, a row may correspond to each wafer W, and as items of the row, the machine log 8923, the process log 8924, the alarm log 8925, and the like may be recorded. It should be noted that an output method for the log information is not limited to a screen but may be printed on a paper sheet.

Figure 12:
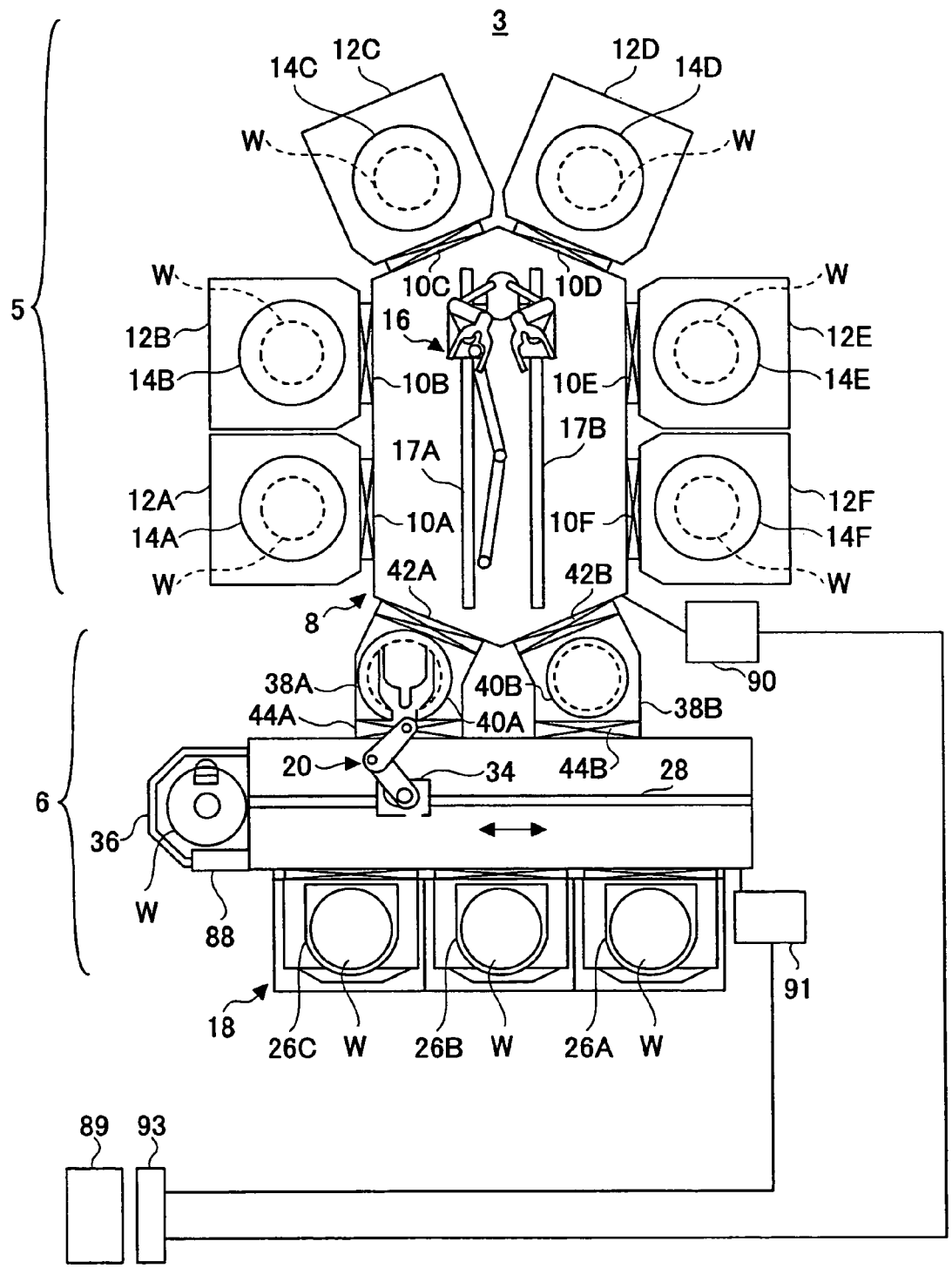
FIG. 12 is a schematic diagram showing a configuration example of a second substrate processing apparatus according to the embodiment of the present invention.
Figure 13:
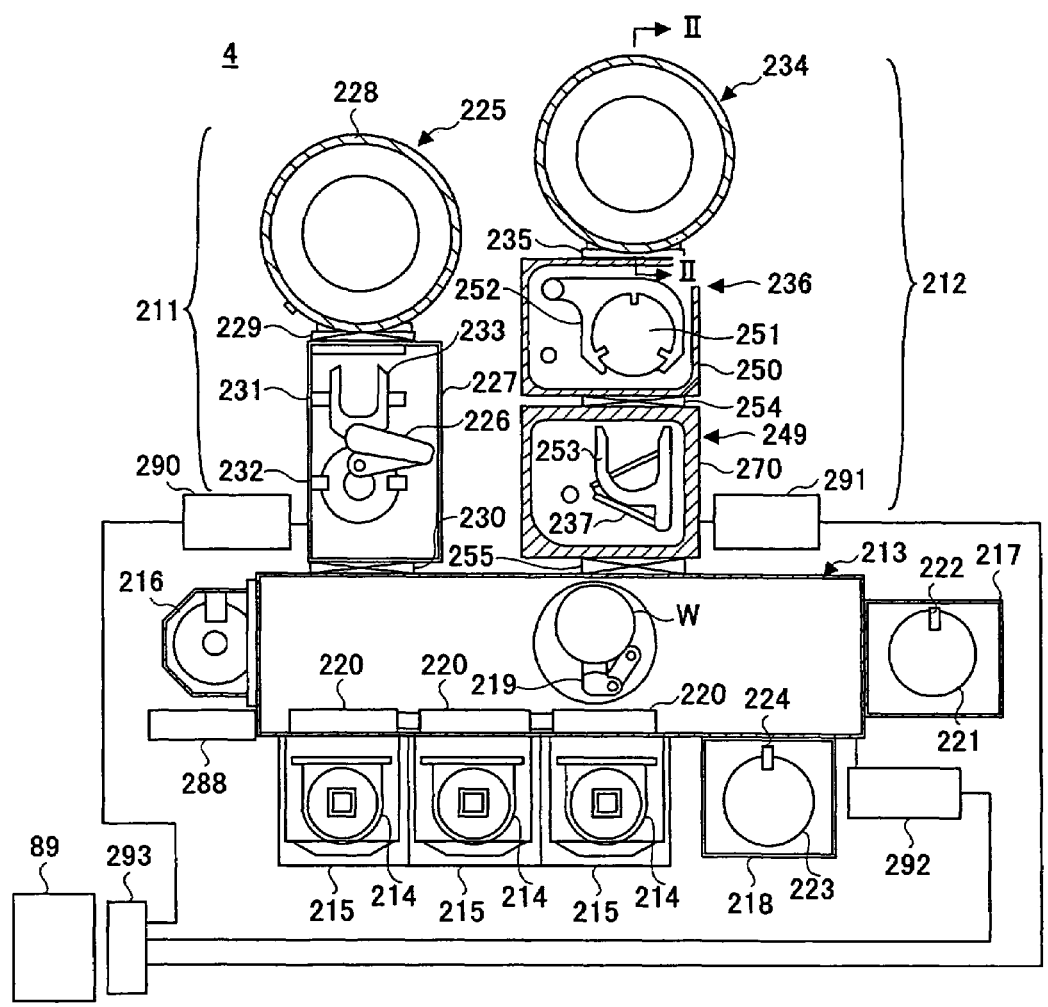
FIG. 13 is a schematic diagram showing a configuration example of a third substrate processing apparatus according to the embodiment of the present invention.

Alternatively, for example, the substrate processing apparatus 2 can be configured as shown in FIG. 12 or FIG. 13. FIG. 12 is a schematic diagram showing a configuration of a second substrate process apparatus according to the embodiment of the present invention. In FIG. 12, parts that are the same as those shown in the previously described figures are given the same reference numbers, and the explanations thereof will be omitted.

The substrate processing apparatus 2 in FIG. 1 includes four process chambers (12A through 12D). On the other hand, differently from the substrate processing apparatus 2 in FIG. 1, a substrate processing apparatus 3 shown in FIG. 12 includes six process chambers (12A through 12F). In addition, a configuration of the transfer chamber 8 is different from the substrate processing apparatus 2 in FIG. 1. In the substrate processing apparatus 3 in FIG. 12, the transfer arm part 16 transfers a wafer W by a translatory movement along the rails 17A and 17B and a rotation movement by setting a starting point of the transfer arm part 16 as a center.

It should be noted that the processes conducted by the EC 89 in the substrate processing apparatus 3 is the same as the substrate processing apparatus 2.

In addition, FIG. 13 is a schematic diagram showing a configuration of a third substrate process apparatus according to the embodiment of the present invention.

In FIG. 13, a substrate processing apparatus 4 includes a first process ship 211 for conducting an RIE (Reactive Ion Etching) process with respect to a wafer W, a second process ship 212, which is arranged in parallel to the first process ship 211, for conducting a COR (Chemical Oxide Removal) process and a PHT (Post Heat Treatment) process with respect to the wafer W to which the RIE is conducted in the first process ship 211, and a loader unit 213 being a rectangle common transfer chamber and connected to each of the first process ship 211 and the second process ship 212.

In addition to the first process ship 211 and the second process ship 212, the loader unit 213 is connected to three FOUP (Front Opening Unified Pod) loading stands 215 each for loading a FOUP as a container containing 25 wafers W, an orienter 216 for determining a position of the wafer W being carried out from the FOUP 214, and a first and second IMS (Integrated Metrology Systems: Therma Wave, Inc.) 217 and 218, respectively for measuring a surface state of the wafer W.

The first process ship 211 and the second process ship 212 are connected to a sidewall of the loader unit 213 in a longitudinal direction, and are arranged to face toward the three FOUP loading stands 215 in a state of clamping the loader unit 213 with the three FOUP loading stands 215. The orienter 216 is arranged at one edge in the longitudinal direction of the loader unit 213, the first IMS 217 is arranged at another edge in the longitudinal direction of the loader unit 213, and the second IMS 218 is arranged in parallel to the three FOUP loading stands 215.

The loader unit 213 includes a carrier arm mechanism 219 of a dual arm type of a scalar type for transferring the wafer W and three load ports 220 arranged at a sidewall so as to correspond to each of the three FOUP loading stands 215 and being an input slot of the wafer W, inside the loader unit 213. The carrier arm mechanism 219 carries out the wafers W from the FOUP 214 loaded on each of the three FOUP loading stands 215 through the load ports 220, and carries out and in the wafers W to and from the first process ship 211, the second process ship 212, the orienter 216, the first IMS 217, and the second IMS 218.

The first IMS 217 is a monitor of an optical system, and includes a loading stand 221 for loading the wafer W being carried in, and an optical sensor 222 for orienting the wafer W being loaded on the loading stand 221. The first IMS 217 measures the surface state of the wafer W, for example, such as a film thickness of a surface layer, CD (Critical Dimension) values such as a wiring groove, a gate electrode, and a like. The second IMS 218 is also a monitor of the optical system, and similar to the first IMS 217, the second IMS 217 includes a loading stand 223 and an optical sensor 224. The second IMS 218 measures the number of particles on a surface of the wafer W.

The first process ship 211 includes a first process unit 225 as a first vacuum process chamber for conducting the RIE process with respect to the wafer W, and a first load lock unit 227 housing a first carrier arm 226 of a single pickup type of a link type for transferring and receiving the wafer W to and from the first process unit 225.

The first process unit 225 includes a cylindrical process chamber, and an upper electrode and a lower electrode arranged in the cylindrical process chamber. The upper electrode is spaced from the lower electrode to make a proper interval to conduct the RIE process with respect to the wafer W. In addition, the lower electrode has an ESC 228 for checking the wafer W by a coulomb force, or a like on a top of the lower electrode.

The first process unit 225 inlets a process gas inside a chamber, generates plasma from the process gas by generating an electric field between the upper electrode and the lower electrode, so as to generate ion and radical from the plasma, and conducts the RIE process with respect to the wafer W by using the ion and radical.

In the first process ship 211, an internal pressure of the loader unit 213 is maintained to be an atmospheric pressure. On the other hand, an internal pressure of the first process unit 225 is maintained to be vacuous. Hence, the first load lock unit 227 is provided with a vacuum gate valve 229 at a coupling part with the first process unit 225, and is also provided with an atmosphere gate valve 230 at a coupling part with loader unit 213, so that the first load lock unit 227 is configured to be a vacuum auxiliary transfer chamber which can adjust an internal pressure of the first load lock unit 227.

The first carrier arm 226 is arranged at an approximately center inside the first load lock unit 227, a first buffer 231 is arranged at a side of the first process unit 225 from the first carrier arm 226, and a second buffer 232 is arranged at a side of the loader unit 213 from the first carrier arm 226. The first buffer 231 and the second buffer 232 are arranged in orbit along which a supporting member (pick) 233 for supporting the wafer W loaded at an end of the first carrier arm 226 is arranged, and temporarily moves the wafer W to which the RIE process is conducted, upward in the orbit of the supporting member 233. Therefore, it is possible to smoothly carry in one wafer W to which the RIE process has not been conducted, to the first process unit 225, and carry out another wafer W which the RIE process is conducted, from the first process unit 225.

The second process ship 212 includes a second process unit 234 as a second vacuum process chamber for conducting the COR process with respect to the wafer W, a third process unit 236 as a third vacuum process chamber for conducting the PHT process with respect to the wafer W and connected to the second process unit 234 through a vacuum gate valve 235, and a second load lock unit 249 internally mounting a second carrier arm 237 of a single type of a link type for carrying in and carrying out the wafer W to and from the second process unit 234 and the third process unit 236.

Figure 14A:
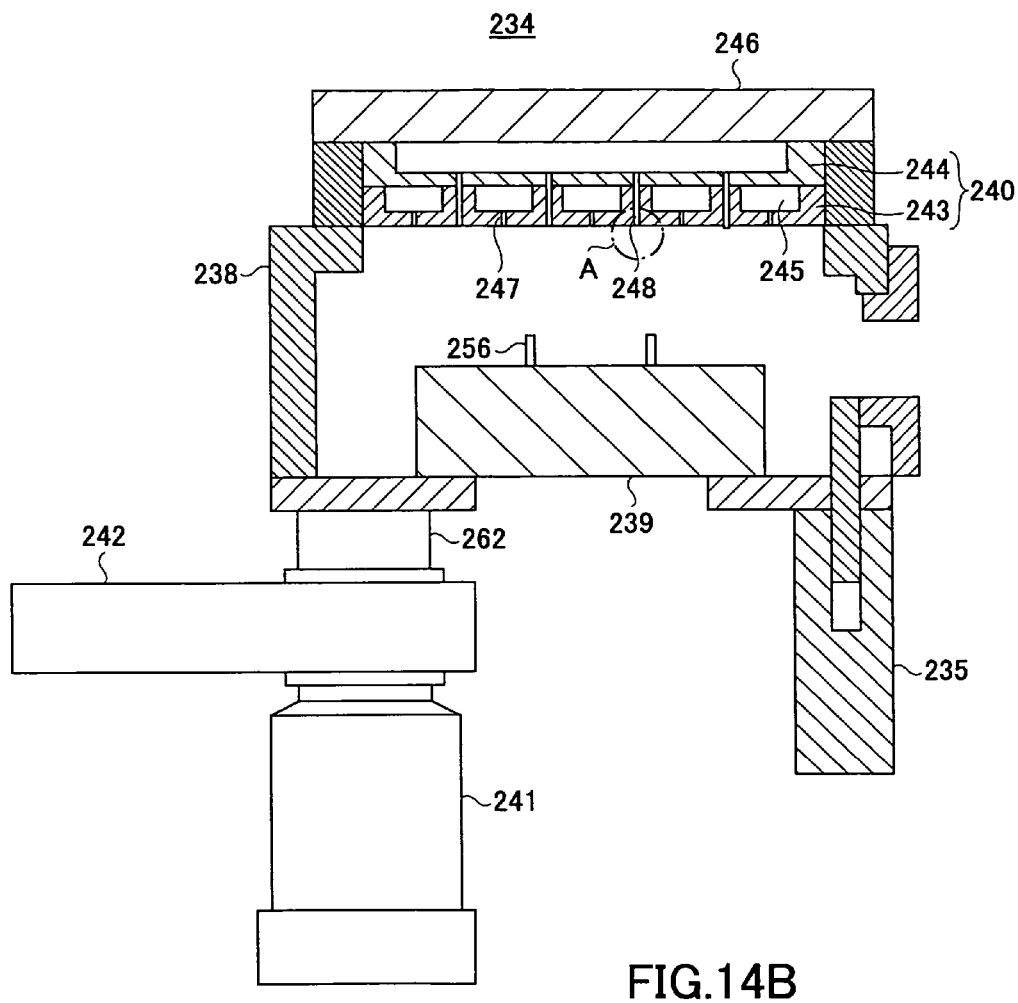
FIG. 14A is a cross sectional view taken on a line II-II of a second process unit in FIG. 13.
Figure 14B:
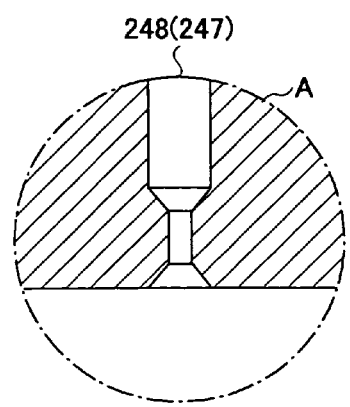
FIG. 14B is an enlarged view of an A portion of the second process unit in FIG. 14A.

The second process unit 234 will be described with reference to FIG. 14A and FIG. 14B. FIG. 14A is a cross sectional view taken on a line II-II of FIG. 13, and FIG. 14B is an enlarged view of an A portion in FIG. 14A.

In FIG. 14A, the second process unit 234 includes a process chamber 238 being cylindrical, an ESC 239 used as a loading stand to load the wafer W arranged in the process chamber 238, a shower head 240 arranged upward the process chamber 238, a TMP (Turbo Molecular Pump) 241 for evacuating a gas and a like in the process chamber 238, and an APC (Automatic Pressure Control) valve 242, which is arranged between the process chamber 238 and the TMP 241, used as a variable valve for controlling a pressure inside the process chamber 238.

The ESC 239 includes an electrode plate (not shown) inside which a direct current voltage is applied, and absorbs and holds the wafer W by a coulomb force or a Johnsen-Rahbek force occurred by the direct current voltage. In addition, the ESC 239 includes a plurality of pusher pins 256 used as lift pins which can be freely projected from an upper surface of the ESC 239. When the wafer W is absorbed to the ESC 239 and held by the ESC 239, the plurality of pusher pins 256 are accommodated in the ESC 239. When the wafer W, to which the COR process is conducted, is carried out from the process chamber 238, the plurality of pusher pins 256 are projected from the upper surface of the ESC 239 and lift the wafer W upward.

The shower head 240 has a two-layer structure. The shower head 240 includes first buffer areas 245 at a bottom layer 243, and includes a second buffer area 246 at a top layer 244. The first buffer areas 245 and the second buffer area 246 are coupled to the process chamber 238 through gas air shafts 247 and gas air shafts 248, respectively. When the COR process is conducted with respect to the wafer W, an $NH_3$ (ammonia) gas is supplied to the first buffer areas 245 from an ammonia gas supply pipe 257 that will be described later. The ammonia gas supplied to the first buffer areas 245 is supplied into the process chamber 238 through the gas air shafts 247. Also, an HF (hydrogen fluoride) gas is supplied to the second buffer area 246 through a hydrofluoric acid gas supply pipe 258, and the HF gas supplied to the second buffer area 246 is supplied into the process chamber 238 through the gas air shafts 248.

Moreover, as shown in FIG. 14B, openings of the gas air shafts 247 and 248 into the process chamber 238 are formed in a divergent shape. By this shape, it is possible to effectively diffuse the ammonia gas or hydrofluoric acid gas into the process chamber 238. Furthermore, since the gas air shafts 247 and 248 have a constriction shape, it is possible to prevent deposits occurred in the process chamber 238 from flowing back to the gas air shafts 247 and 248, and to further prevent the deposits from flowing back to the first buffer areas 245 and the second buffer area 246. It should be noted that the gas air shafts 247 and 248 may be spiral air shafts.

The second process unit 234 conducts the COR process with respect to the wafer W by adjusting each volume flow rate of a pressure inside the process chamber 238 and each of the ammonia gas and the hydrofluoric acid gas.

Referring back to FIG. 13, the third process unit 236 includes a process chamber 250 having a chassis shape, a stage heater 251 used as a loading stand of the wafer W arranged in the process chamber 250, and a buffer arm 252, which is arranged so as to surround the stage heater 251, for lifting the wafer W loaded on the stage heater 251 upward.

The stage heater 251 is made up of aluminum on a surface of which an oxide film is formed, and heats the wafer W being loaded, until a predetermined temperature by heating wires and a like internally mounted. The buffer arm 252 temporarily moves the wafer W to which the COR process is conducted, upward of an orbit of a supporting member 253 in the second carrier arm 237. Therefore, it is possible to smoothly carry in and carry out the wafer W in the second process unit 234 and the third process unit 236.

The third process unit 236 conducts the PHT process to the wafer W by adjusting a temperature of the wafer W.

The second load lock unit 249 includes a transfer chamber 270 having a chassis shape and internally mounting the second carrier arm 237. An internal pressure of the loader unit 213 is maintained to be an atmosphere pressure. On the other hand, internal pressures of the second process unit 234 and the third process unit 236 are maintained to be vacuous. Accordingly, the second load lock unit 249 including a vacuum gate valve 254 at a coupling part to the third process unit 236, and an atmosphere door valve 255 a coupling part to the loader unit 213, to be used as a vacuum auxiliary transfer chamber which can adjust its internal pressure.

Figure 15:
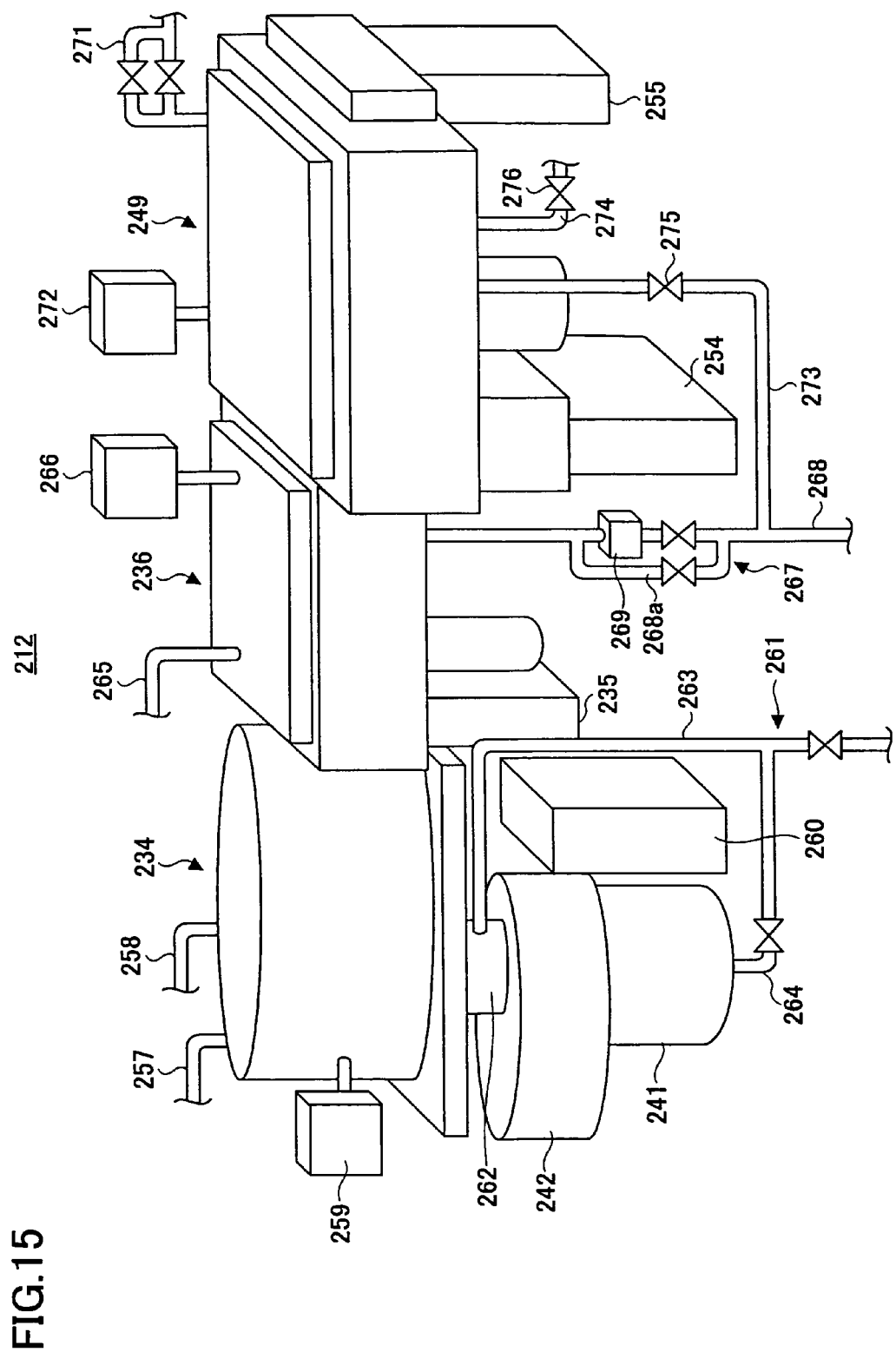
FIG. 15 is a perspective diagram showing a schematic configuration of a second process ship according to the embodiment of the present invention.

FIG. 15 is a perspective diagram showing a schematic configuration of the second process ship 212.

In FIG. 15, the second process unit 234 includes an ammonia gas supply pipe 257 for supplying an ammonia gas to the first buffer area 245, a hydrofluoric acid gas supply pipe 258 for supplying a hydrofluoric acid gas to the second buffer area 246, a pressure gauge 259 for supplying the hydrofluoric acid gas to the second buffer area 246, a pressure gauge 259 for measuring a pressure in the process chamber 238, and a chiller unit 260 for supplying a refrigerant to a cooling system arranged in the ESC 239.

The ammonia gas supply pipe 257 is provided with a MFC (Mass Flow Controller) (not shown), and the MFC adjusts a flow rate of the ammonia gas to supply to the first buffer area 245. The hydrofluoric acid gas supply pipe 258 is also provided with another MFC (not shown), and the MFC adjusts a flow rate of the hydrofluoric acid gas to supply to the second buffer area 246. The MFC of the ammonia gas supply pipe 257 cooperates with the MFC of the hydrofluoric acid gas supply pipe 258, so as to adjusts a volume flow rate of the ammonia gas and the hydrofluoric acid gas, which are supplied to the process chamber 238.

Moreover, a second process unit exhaust system 261 connected to a DP (Dry Pump) (not shown) is arranged downward of the second process unit 234. The second process unit exhaust system 261 includes an exhaust pipe 263 communicating with a ventilation duct 262 arranged between the process chamber 238 and The APC 242, and the exhaust pipe 263 connected downward the TMP 241 (evacuation side), and exhausts a gas and a like in the process chamber 238. It should be noted that the exhaust pipe 264 is connected to the exhaust pipe 263 in front of the DP.

The third process unit 236 includes a nitrogen gas supply pipe 265 for supplying a nitrogen gas to the process chamber 250, a pressure gauge 266 for measuring a pressure in the process chamber 250, and a third process unit exhaust system 267 for exhausting the nitrogen gas and the like in the process chamber.

The nitrogen gas supply pipe 265 is provided with an MFC (not shown), and the MFC adjusts a flow rate of the nitrogen gas to supply to the process chamber 250. The third process unit exhaust system 267 includes a main exhaust pipe 268 communicating to the process chamber 250 and being connected to the DP, an APC valve 269 arranged in a middle of the main exhaust pipe 268, and a sub-exhaust pipe 268a branching from the main exhaust pipe 268 so as to avoid the APC valve 269 and being connected to the main exhaust pipe 268 in front of the DP. The APC valve 269 controls the pressure in the process chamber 250.

The second load lock unit 249 includes a nitrogen gas supply pipe 271 for supplying a nitrogen gas to the transfer chamber 270, a pressure gauge 272 for measuring the pressure in the transfer chamber 270, a second load lock unit exhaust system 273 for exhausting the nitrogen gas and the like in the transfer chamber 270, and an atmosphere communicating pipe 274 for releasing an atmosphere in the transfer chamber 270.

The nitrogen gas supply pipe 271 is provided with an MFC (not shown), and the MFC adjusts a flow rate of a nitrogen gas to supply to the transfer chamber 270. The second load lock unit exhaust system 273 is made up of a single exhaust pipe, and the exhaust pipe is communicated with the transfer chamber 270, and is connected to the main exhaust pipe 268 in the third process unit exhaust system 267 in front of the DP. Moreover, each of the second load lock unit exhaust system 273 and the atmosphere communicating pipe 274 includes an evacuation valve 275 and a relief valve 276, which may be freely opened and closed. The evacuation valve 275 and the relief valve 276 are cooperated with each other and adjust the pressure in the transfer chamber 270 from the atmosphere pressure to a desired vacuum degree.

Figure 16:
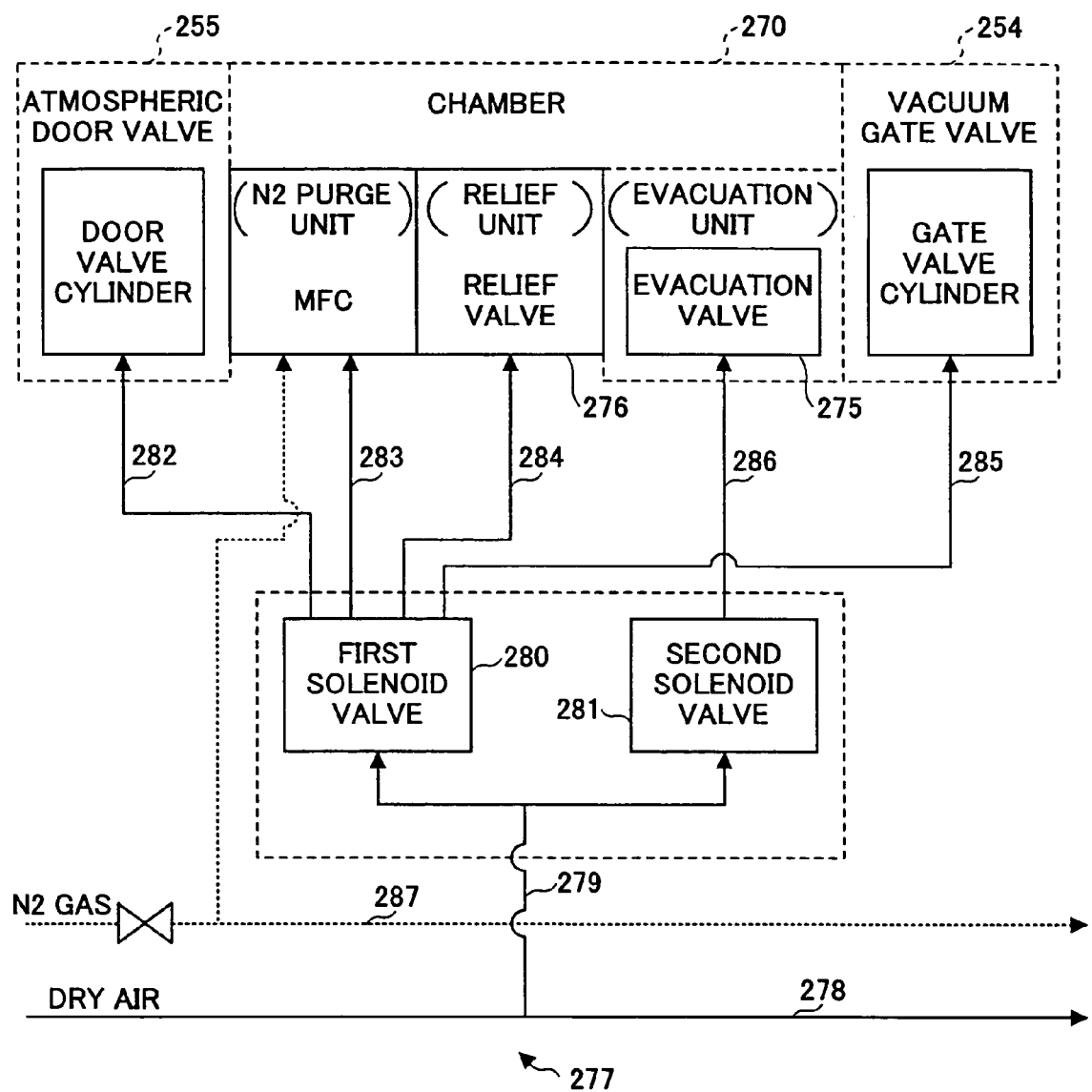
FIG. 16 is a schematic diagram showing a configuration of a dry air supply system for driving a second load lock unit according to the embodiment of the present invention.

FIG. 16 is a schematic diagram showing a configuration of a dry air supply system for driving the second load lock unit 249.

In FIG. 16, the dry air supply system 277 for driving the second load lock unit 249 supplies the dry air to a door valve cylinder for driving a slide door, which is included in the atmosphere door valve 255, an MFC included in the nitrogen gas supply pipe 271 as a N2 purge unit, a relief valve 276 included in the atmosphere communicating pipe 274 as a relief unit for releasing the atmosphere, the evacuation valve 275 included in the second load lock unit exhaust system 273 as an evacuation unit, and a gate valve cylinder for driving a slide gate included a vacuum gate valve 254.

The dry air supply system 277 includes a sub-dry air supply pipe 279 branching from the main dry air supply pipe 278 included in the second process ship 212, and a first solenoid valve 280 and a second solenoid valve 281 which are connected to the sub-dry air supply pipe 279.

The first solenoid valve 280 is connected to the door valve cylinder, the MFC, the relief valve 276, and the gate valve cylinder through a dry air supply pipes 282, 283, 284, and 285, and controls an operation of each part by controlling a supply rate of the dry air. Moreover, the second solenoid valve 281 is connected to the evacuation valve 275 through a dry air supply pipe 286, and controls an operation of the evacuation valve 275 by controlling a supply rate of the dry air to the evacuation valve 275.

It should be noted that the MFC in the nitrogen gas supply pipe 271 is also connected to a nitrogen (N2) gas supply system 287.

Moreover, each of the second process unit 234 and the third process unit 236 includes a dry air supply system for driving the unit similar to the dry air supply system 277 for driving the second load lock unit 249.

Referring back to FIG. 13, the substrate processing apparatus 4 includes a system controller for controlling operations of the first process ship 211, the second process ship 212, and the loader unit 213, and an operation controller 288 arranged at one edge in a longitudinal direction of the loader unit 213.

Similar to the operation controller 88 in FIG. 1, for example, the operation controller 288 includes a displaying part made up of an LCD (Liquid Crystal Display), and the displaying part displays the operation state, the log information, and the like of each of the configuration elements of the substrate processing apparatus 4.

Figure 17:
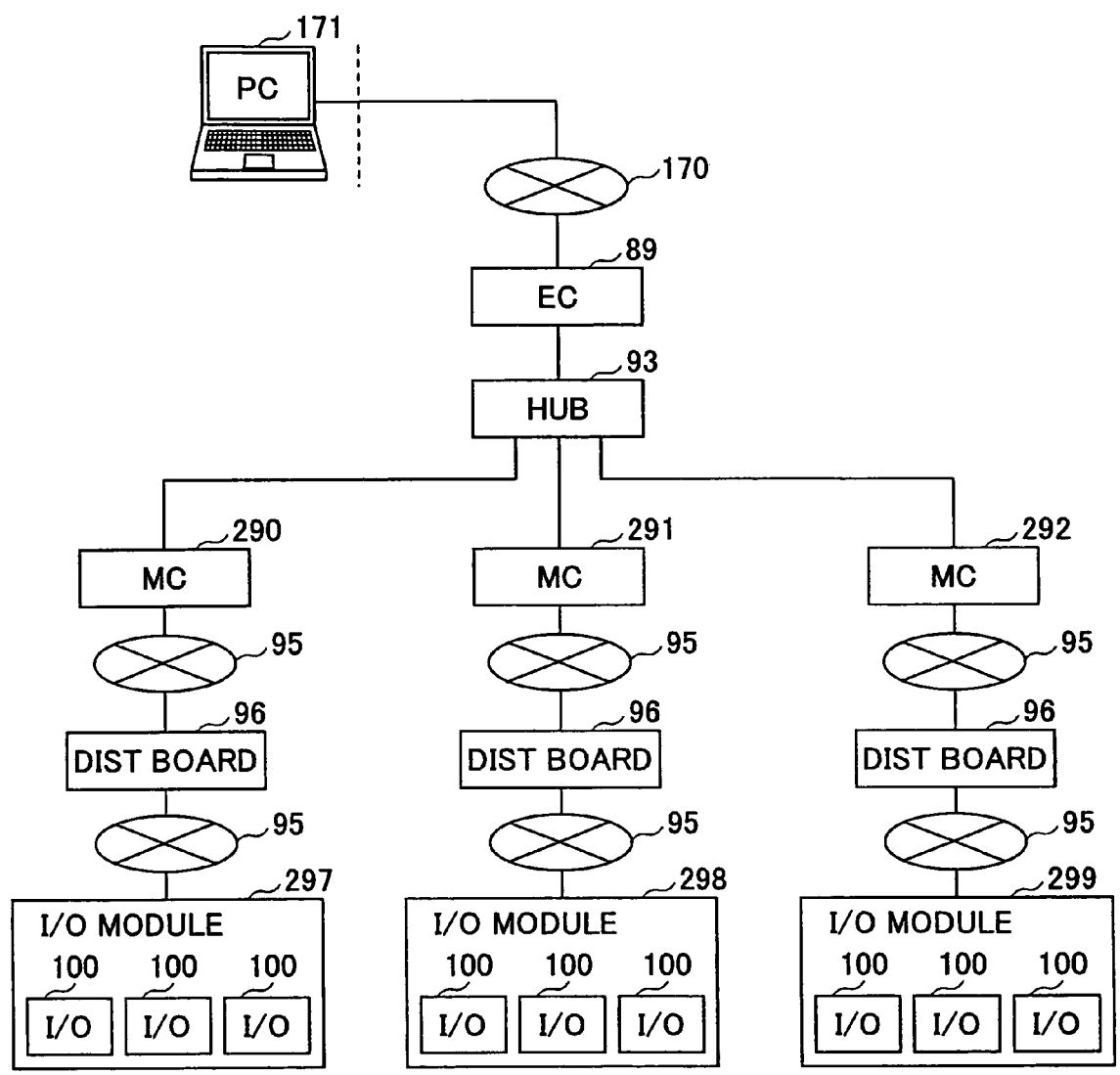
FIG. 17 is a diagram showing a configuration example of a system controller in a third substrate processing apparatus according to the embodiment of the present invention.

FIG. 17 is a diagram showing a configuration of the system controller in the third substrate processing apparatus according to the embodiment of the present invention. In FIG. 17, parts that are the same as those shown in FIG. 2 are given the same reference numbers, and the explanations thereof will be omitted.

In FIG. 17, the MC 290, the MC 291, and the MC 292 are sub-controlling parts (slave controlling parts) for controlling operations of the first process ship 211, the second process ship 212, and the loader unit 213, respectively. Similar to FIG. 2, the MC 290, the MC 291, and the MC 292 are connected to the I/O (Input/Output) modules 297, 298, and 299, respectively, through the GHOST network 95 by the DIST (Distribution) board 96.

Moreover, I/O modules 297, 298, and 299 are configured similar to the I/O modules 97 and 98 shown in FIG. 2. However, in FIG. 17, I/O modules 297, 298, and 299 correspond to the first process ship 211, the second process ship 212, and the loader unit 213.

A log information recording process and a log information displaying process executed by the EC 89 are based on the process procedures as the processes executed by the EC 89 shown in FIG. 2. Accordingly, it is possible to confirm the log information concerning the substrate processing apparatus 4 in FIG. 13 for each wafer W, and it is possible to reduce a workload of tracing the cause of the defective product, similar to the substrate processing apparatus 2 shown in FIG. 1. It should be noted that in the substrate processing apparatus 4 in FIG. 13, at least the carrier arm mechanism 219, the first carrier arm, and the second carrier arm form a transferring part.

According to the present invention, it is possible to provide a substrate processing apparatus, a history information recording method, a history information recording program, and a history information recording system, which can reduce a workload concerning a trace of a cause of an error or a like.

The present invention is not limited to these embodiments, but variations and modifications may be made without departing from the scope of the present invention.

This patent application is based on Japanese Priority Patent Application No. 2005-095123 filed on Mar. 29, 2005, the entire contents of which are hereby incorporated by reference.

What is claimed is:

1. A substrate processing apparatus including a plurality of process chambers for processing a substrate and a transfer part for carrying in and carrying out the substrate to and from the plurality of process chambers, said substrate processing comprising:
 a transfer history recording part configured to relate history information concerning a transfer of the substrate by the transfer part to substrate identification information for each substrate, and configured to record the history information concerning the transfer of the substrate as first history information;
 a process history recording part configured to relate history information concerning a process state of the substrate in each of the plurality of process chambers to the substrate identification information for each substrate subject to be processed, and configured to record the history information concerning the process state as second history information;
 an alarm history recording part configured to relate history information concerning an alarm occurred in at least one of the transfer part and the process chambers to the substrate identification information for each substrate, and configured to record the history information concerning the alarm as third history information;
 an inputting part configured to allow an operator to input the substrate identification information specifying one or more substrates; and
 an extracting part configured to extract history information related to the substrate identification information inputted by the operator from the first history information, the second history information, and the third history information.

2. The substrate processing apparatus as claimed in claim 1, further comprising a recording part recording process information concerning a substrate process in each of the plurality of process chambers,
 wherein the process history recording part relates a copy of the process information to each substrate, and records the copy as the second history information.

3. The substrate processing apparatus as claimed in claim 1, wherein:
 the recording part records management information concerning the process information; and
 the process history recording part relates a copy of the management information to each substrate and records the copy as the second history information.

4. The substrate processing apparatus as claimed in claim 1, further comprising a displaying part configured to display the history information extracted by the extracting part for each substrate at a display unit.

5. The substrate processing apparatus as claimed in claim 1, wherein the substrate identification information indicates a location where the wafer is accommodated.

6. A history information recording method performed in a substrate processing apparatus including a plurality of process chambers for processing a substrate and a transfer part for carrying in and carrying out the substrate to and from the plurality of process chambers, said history information recording method comprising the steps of:
 relating history information concerning a transfer of the substrate by the transfer part to substrate identification information for each substrate, and recording the history information concerning the transfer of the substrate as first history information;
 relating history information concerning a process state of the substrate in each of the plurality of process chambers to substrate identification information for each substrate subject to be processed, and recording the history information concerning the process state as second history information;
 relating history information concerning an alarm occurred in at least one of the transfer part and the process chambers to substrate identification information for each substrate, and recording the history information concerning the alarm as third history information;
 allowing an operator to input the substrate identification information specifying one or more substrates; and
 extracting history information related to the substrate identification information inputted by the operator from the first history information, the second history information, and the third history information.

7. A history information recording program product for causing a substrate processing apparatus to record history information, substrate processing apparatus including a plurality of process chambers for processing a substrate and a transfer part for carrying in and carrying out the substrate to and from the plurality of process chambers, said history information recording program product comprising a computer-readable medium encoded with a computer program that comprises the codes for:
 relating history information concerning a transfer of the substrate by the transfer part to substrate identification information for each substrate, and recording the history information concerning the transfer of the substrate as first history information;
 relating history information concerning a process state of the substrate in each of the plurality of process chambers to substrate identification information for each substrate subject to be processed, and recording the history information concerning the process state as second history information;
 relating history information concerning an alarm occurred in at least one of the transfer part and the process chambers to substrate identification information for each substrate, and recording the history information concerning the alarm as third history information;
 allowing an operator to input the substrate identification information specifying one or more substrates; and extracting history information related to the substrate identification information inputted by the operator from the first history information, the second history information, and the third history information.

8. The history information recording program product as claimed in claim 7, wherein the substrate identification information indicates a location where the wafer is accommodated.

9. A history information recording system including a sub-control unit for controlling a plurality of process chambers for processing a substrate and a transfer part for carrying in and carrying out the substrate to and from the plurality of process chambers, and a main control unit for controlling a substrate processing apparatus provided with the plurality of process chambers and the transfer part through the sub-control part, wherein:

the main control unit comprises:
- a transfer history recording part configured to relate history information concerning a transfer of the substrate by the transfer part to substrate identification information for each substrate, and configured to record the history information concerning the transfer of the substrate as first history information;
- a process history recording part configured to relate history information concerning a process state of the substrate in each of the plurality of process chambers to substrate identification information for each substrate subject to be processed, and configured to record the history information concerning the process state as second history information;
- an alarm history recording part configured to relate history information concerning an alarm occurred in at least one of the transfer part and the process chambers to substrate identification information for each substrate, and configured to record the history information concerning the alarm as third history information;
- an inputting part configured to allow an operator to input the substrate identification information specifying one or more substrates; and
- an extracting part configured to extract history information related to the substrate identification information inputted by the operator from the first history information, the second history information, and the third history information.

10. The history information recording program product as claimed in claim 9, wherein the substrate identification information indicates a location where the wafer is accommodated.

* * * * *